(12) United States Patent
Kanamori et al.

(10) Patent No.: US 10,396,092 B2
(45) Date of Patent: Aug. 27, 2019

(54) VERTICAL MEMORY DEVICE AND METHOD OF MANUFACTURING THE SAME

(71) Applicants: Kohji Kanamori, Seoul (KR); Dong-Seog Eun, Seongnam-si (KR)

(72) Inventors: Kohji Kanamori, Seoul (KR); Dong-Seog Eun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/455,778

(22) Filed: Mar. 10, 2017

(65) Prior Publication Data
US 2018/0033799 A1    Feb. 1, 2018

(30) Foreign Application Priority Data
Jul. 27, 2016    (KR) .................. 10-2016-0095738

(51) Int. Cl.
| | | |
|---|---|---|
| H01L 27/00 | (2006.01) | |
| H01L 27/11582 | (2017.01) | |
| H01L 27/1157 | (2017.01) | |
| H01L 27/11565 | (2017.01) | |

(52) U.S. Cl.
CPC .... *H01L 27/11582* (2013.01); *H01L 27/1157* (2013.01); *H01L 27/11565* (2013.01)

(58) Field of Classification Search
None
See application file for complete search history.

(56) References Cited

U.S. PATENT DOCUMENTS

| | | |
|---|---|---|
| 7,679,133 B2 | 3/2010 | Son et al. |
| 8,187,936 B2 | 5/2012 | Alsmeier et al. |
| 8,445,347 B2 | 5/2013 | Alsmeier |
| 8,455,940 B2 | 6/2013 | Lee et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,658,499 B2 | 2/2014 | Makala et al. |
| 8,723,247 B2 | 5/2014 | Komori et al. |
| 8,872,254 B2 | 10/2014 | Lee et al. |

(Continued)

*Primary Examiner* — Reema Patel
(74) *Attorney, Agent, or Firm* — Harness, Dickey & Pierce, P.L.C.

(57) ABSTRACT

Disclosed are vertical memory devices and methods of manufacturing the same. The vertical memory device may include includes a substrate, a gate stack structure and channel structure on the substrate, and a charge trap structure between the gate stack structure and the channel structure. The gate stack structure includes conductive structures and insulation interlayer structures that are alternately stacked on each other in a vertical direction on the substrate such that cell regions and inter-cell regions are alternately arranged in the vertical direction. The channel structure penetrates through the gate stack structure in the vertical direction. The charge trap structure and the conductive structures define memory cells at the cell regions. The charge structure is configured to selectively store charges. The charge trap structure includes an anti-coupling structure in the inter-cell region for reducing a coupling between neighboring memory cells adjacent to each other in the vertical direction.

17 Claims, 44 Drawing Sheets

(56) References Cited

U.S. PATENT DOCUMENTS

| | | |
|---|---|---|
| 8,877,590 B1 | 11/2014 | Lee |
| 2011/0147823 A1* | 6/2011 | Kuk .................. H01L 27/11551 |
| | | 257/324 |
| 2011/0233468 A1 | 9/2011 | Zong et al. |
| 2012/0098048 A1* | 4/2012 | Choe ................... H01L 29/7926 |
| | | 257/324 |
| 2014/0286098 A1 | 9/2014 | Yasuda |
| 2015/0194440 A1 | 7/2015 | Noh et al. |
| 2015/0294980 A1 | 10/2015 | Lee et al. |
| 2015/0380422 A1 | 12/2015 | Sharangpani et al. |
| 2015/0380431 A1 | 12/2015 | Kanamori et al. |
| 2016/0043093 A1 | 2/2016 | Lee et al. |
| 2016/0064409 A1 | 3/2016 | Yaegashi |

\* cited by examiner

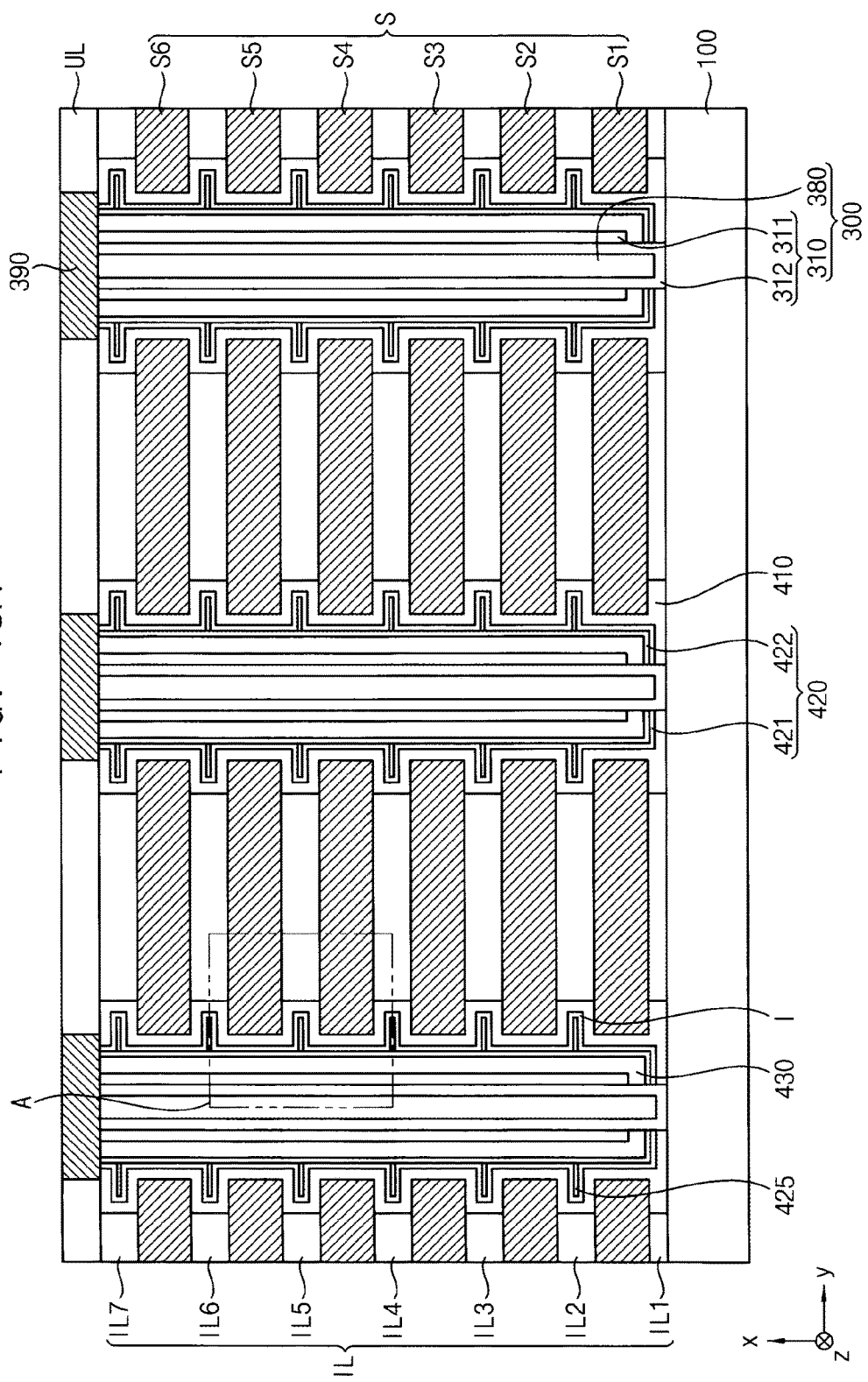

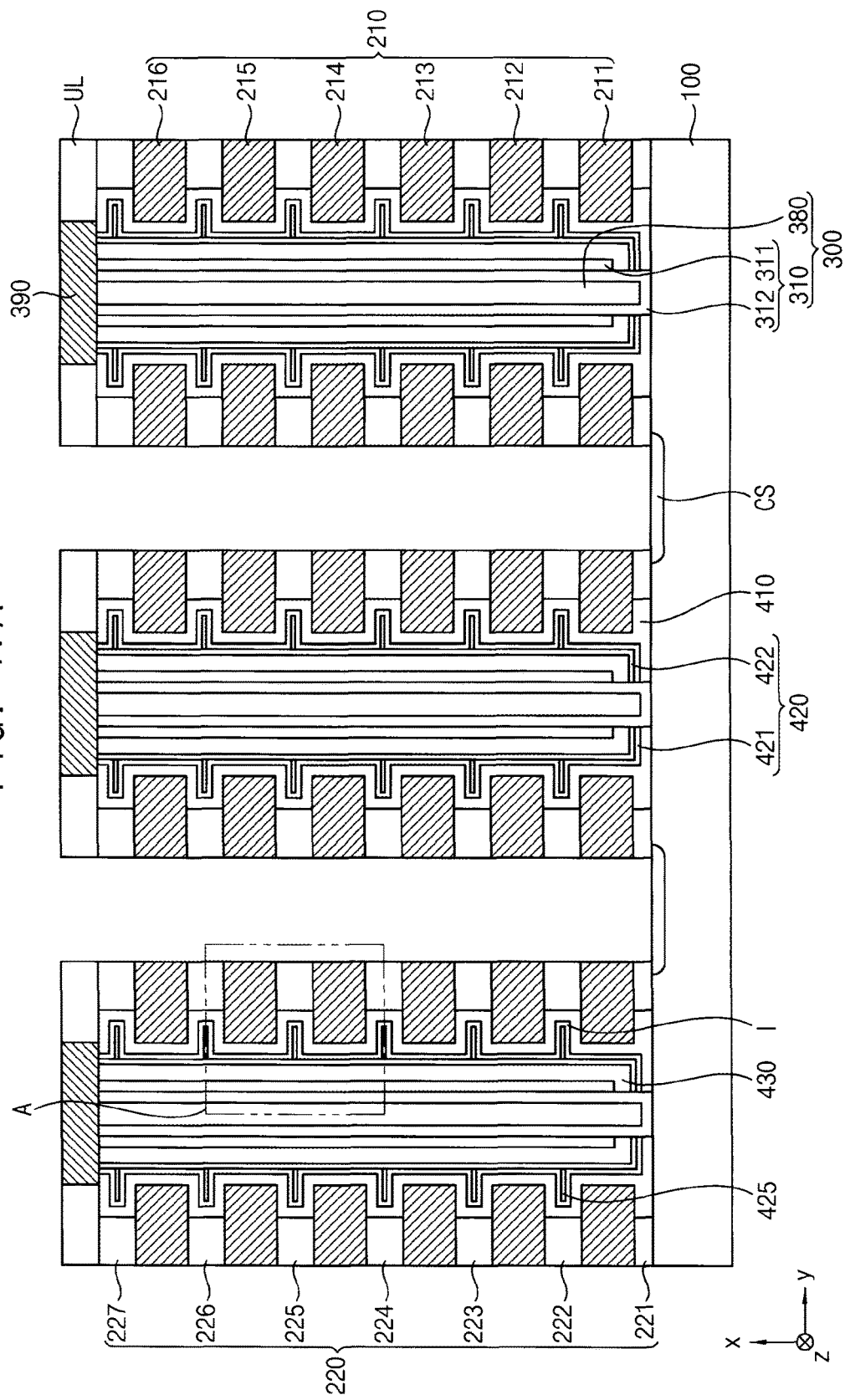

VERTICAL MEMORY DEVICE AND METHOD OF MANUFACTURING THE SAME

CROSS-REFERENCE TO RELATED APPLICATIONS

This application claims priority under 35 U.S.C § 119 to Korean Patent Application No. 10-2016-0095738 filed on Jul. 27, 2016 in the Korean Intellectual Property Office, the contents of which are incorporated by reference herein in their entirety.

BACKGROUND

1. Field

Example embodiments relate to a vertical memory device and a method of manufacturing the same, and more particularly, to a vertical NAND flash memory device and/or a method of manufacturing the same.

2. Description of Related Art

A vertical NAND flash memory device in which a plurality of memory cells is vertically stacked on a substrate has been proposed for increasing memory capacity of the NAND memory devices.

As the vertical NAND flash memory device tend to be downsized together with high stack density of the memory cells, the electron diffusion and the cross talk occurs much more frequently between the vertically neighboring stack cells, which affect the reliability of the vertical NAND flash memory device.

For reducing and/or minimizing the electron diffusion and the cross talk between the vertically stack cells, a charge trap pattern is provided as a separate pattern by each cell in the vertical direction.

As the stack density of the memory cells increases in the vertical NAND flash memory devices, the vertical gap distances of the memory cells are shortened and as a result, the height of the charge trap pattern also decreases in the vertical NAND flash memory devices. Accordingly, the trap density in the charge trap pattern is not sufficient each cell of the vertical NAND flash memory device, which makes the memory window size of the flash memory device very variable and unstable in response to the size of the flash memory device.

In addition, the reduction of the vertical gap distance between the neighboring stack cells usually cause the electron diffusion and the cross talk between the neighboring stack cells in the vertical NAND flash memory device.

SUMMARY

Some example embodiments of inventive concepts provide a vertical memory device in which the charge trap pattern in a cell region and the dielectric inter-cell pattern in an inter-cell region are increased to thereby increase the trap density of the charge trap pattern and decrease the cross talk between the neighboring stack cells.

Some example embodiments of inventive concepts also provide a method of manufacturing the above vertical memory device.

According to some example embodiments of inventive concepts, a vertical memory device includes a substrate, a gate stack structure on the substrate, a channel structure on the substrate, and a charge trap structure between the gate stack structure and the channel structure. The gate stack structure includes conductive structures and insulation interlayer structures that may be alternately stacked on each other in a vertical direction such that cell regions and inter-cell regions may be alternately arranged in the vertical direction. The channel structure may penetrate through the gate stack structure in the vertical direction. The charge trap structure and the conductive structures may define memory cells at the cell regions. The charge trap structure may be configured to selectively store charges. The charge trap structure may contain an anti-coupling structure in the inter-cell region. The anti-coupling structure may reduce a coupling between neighboring memory cells adjacent to each other in the vertical direction.

According to other example embodiments of inventive concepts, a method of manufacturing a vertical memory device may include alternately stacking insulation interlayers and sacrificial layers on a substrate; forming a channel hole through the insulation interlayers and the sacrificial layers, the channel hole partially exposing the substrate; forming an inter-cell recess defined by the insulation interlayers and the sacrificial layers by partially removing the insulation interlayers, the inter-cell recess ins communication with the channel hole; forming a block layer and a first trap layer on a sidewall wall of the channel hole along a surface profile of the inter-cell recess; forming a polysilicon pattern in the inter-cell recess defined by the block layer and the first trap layer, forming an anti-coupling structure in the inter-cell recess by performing an oxidation process to the polysilicon pattern, a dielectric constant of the anti-coupling structure being smaller than that of the first trap layer; forming a second trap layer on the first trap layer and the anti-coupling structure; and forming a tunnel insulation layer on the second trap layer.

According to some example embodiments of inventive concepts, the charge trap pattern may include first and second patterns continuously or discontinuously extending in the vertical direction. The first and the second patterns may be combined into a single combined pattern in the cell region and may be separated into a separated pattern in the inter-cell region in such a configuration that the anti-coupling structure may be enclosed by the separated pattern. The combined pattern may have a relatively larger thickness and the separated pattern may have a relatively smaller thickness, so the charge density in the cell region may increase in the cell region. In addition, the first and the second patterns may be elongated or be broken in the inter-cell region and the electron path for electron diffusion between the charge trap patterns in the cell region may be elongated or broken, which may prevent the electron diffusion between the neighboring stack cells and increase the charge density of the charge trap pattern.

Further, the anti-coupling structure may be indented into the inter-cell recess and the dielectric constant thereof may be smaller than those of the first and the second patterns, thus the neighboring gate electrodes of the vertical memory device may be sufficiently insulated and the coupling between the neighboring stack cells may be reduced and/or minimized in the vertical memory device. When the air gap may be provided with the anti-coupling structure, an overall dielectric constant of the anti-coupling structure may be much smaller than those of the first and the second patterns, thereby more sufficiently preventing the coupling between the neighboring stack cells in the vertical memory device. Accordingly, the operation reliability and stability of the vertical memory device may be sufficiently improved in spite of the high integration degree and the size down of the memory device.

According to some example embodiments of inventive concepts, a vertical memory device may include a substrate, a gate stack structure on the substrate, and a channel structure extending in a vertical direction through the gate stack structure, and a charge trap structure surrounding the channel structure. The gate stack structure may include a plurality of conductive layers and a plurality of insulating layers alternately stacked on top of each other. The charge trap structure may include a plurality of anti-coupling structures spaced apart from each other in the vertical direction along the channel structure at heights above the substrate corresponding to the plurality of insulating layers such that the anti-coupling structures are between the channel structure and the plurality of insulating layers.

BRIEF DESCRIPTION OF THE DRAWINGS

These and other features of inventive concepts will become more apparent by describing in detail some example embodiments of inventive concepts thereof with reference to the accompanying drawings of which:

FIGS. 8A to 17A, are cross-sectional views illustrating processing steps for a method of manufacturing the vertical memory device shown in FIGS. 1 to 4;

FIGS. 8B to 17B are enlarged views of portion A in FIGS. 8A to 17A;

DETAILED DESCRIPTION

Figure 1:
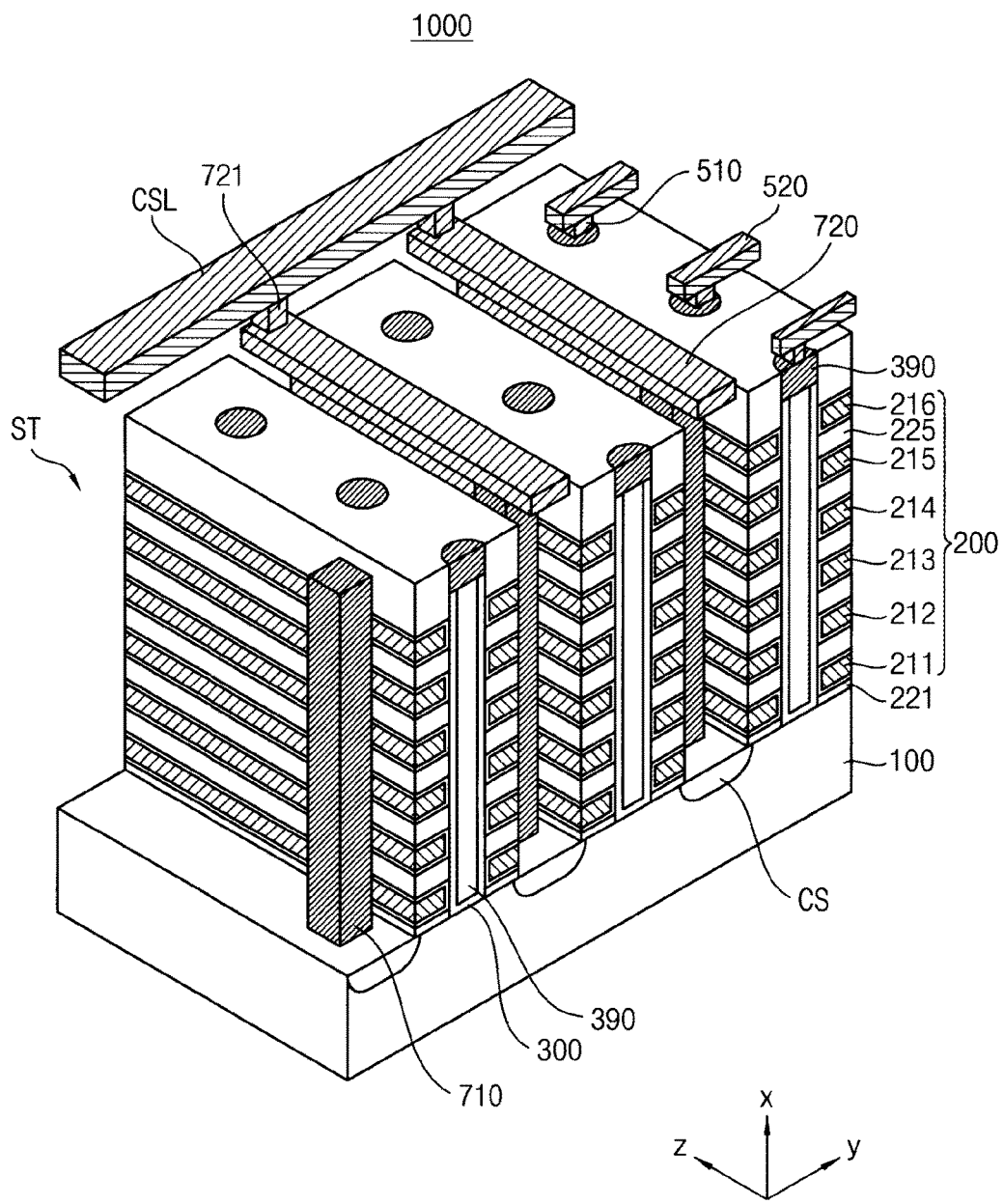
FIG. 1 is a perspective view illustrating a vertical non-volatile memory device in accordance with some example embodiments of inventive concepts.

Reference will now be made to some example embodiments, which are illustrated in the accompanying drawings, wherein like reference numerals may refer to like components throughout.

Figure 2:
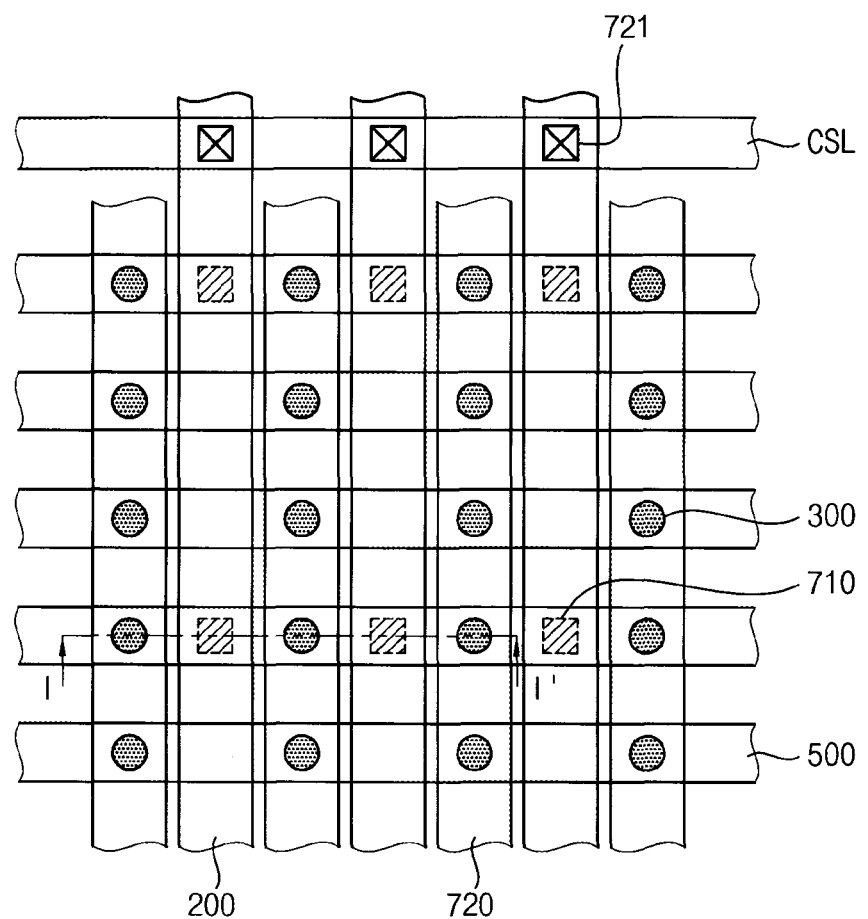
FIG. 2 is a plan view illustrating the vertical non-volatile memory device shown in FIG. 1.
Figure 3:
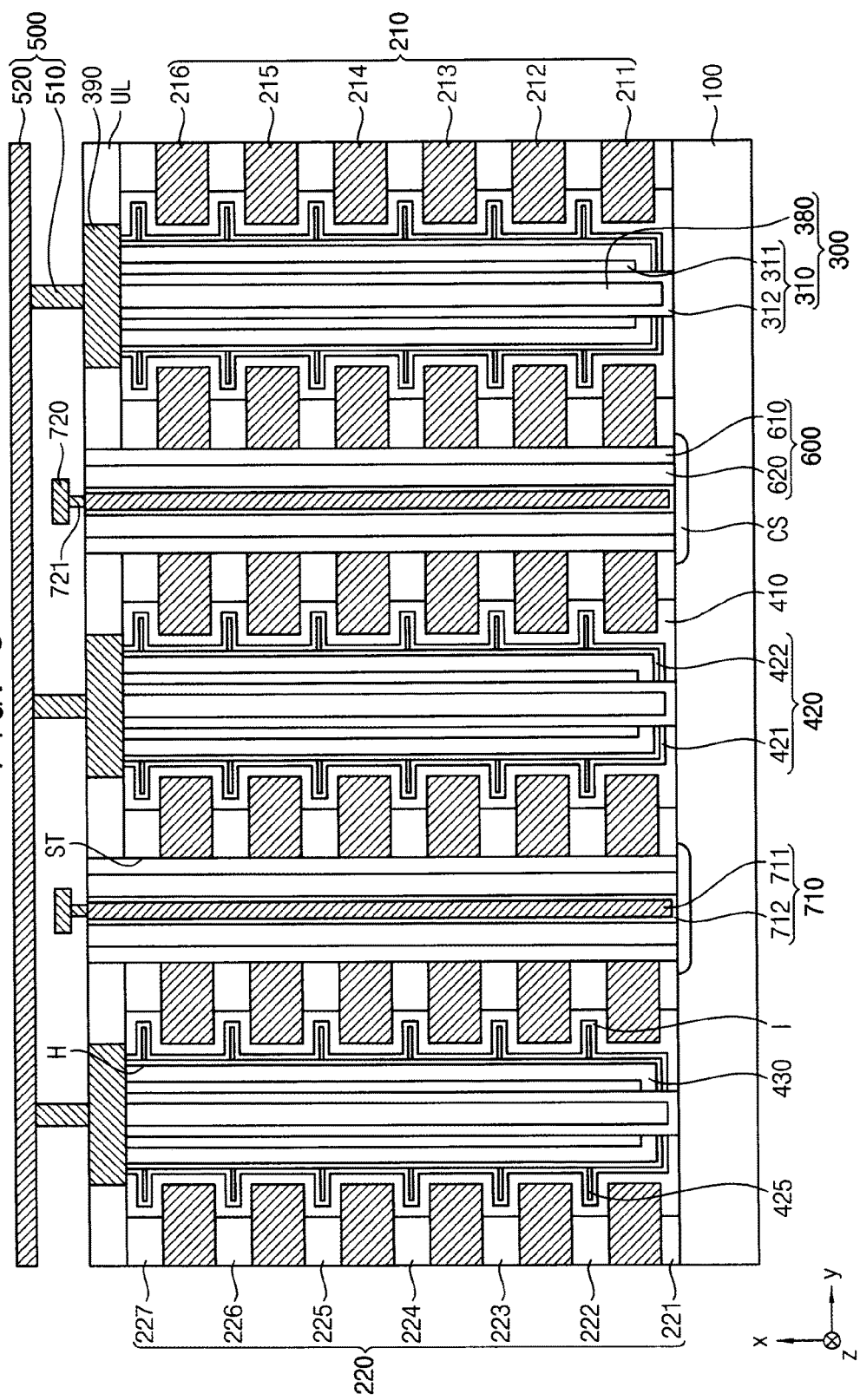
FIG. 3 is a cross sectional view illustrating the vertical non-volatile memory device shown in FIG. 1 cut along a line I-I' of FIG. 2.
Figure 4:
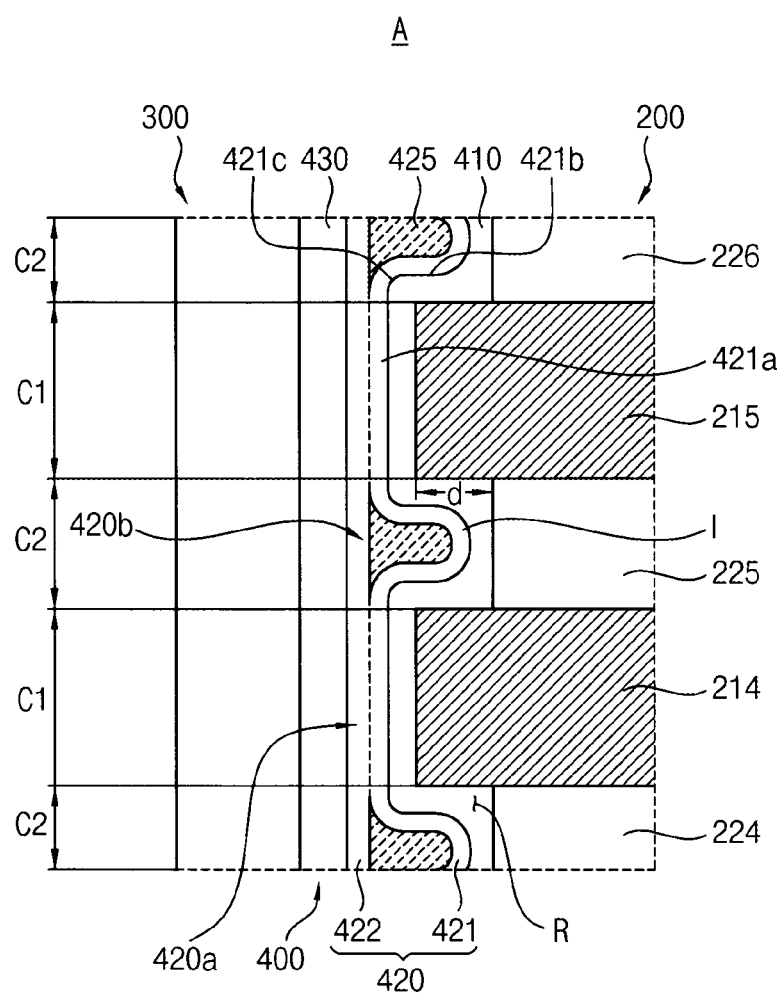
FIG. 4 is an enlarged view of a portion A of FIG. 3.

FIG. 1 is a perspective view illustrating a vertical non-volatile memory device in accordance with some example embodiments of inventive concepts, and FIG. 2 is a plan view illustrating the vertical non-volatile memory device shown in FIG. 1. FIG. 3 is a cross sectional view illustrating the vertical non-volatile memory device shown in FIG. 1 cut along a line I-I' of FIG. 2. FIG. 4 is an enlarged view of a portion A of FIG. 3.

Referring to FIGS. 1 to 4, the vertical non-volatile memory device 1000 in accordance with some example embodiments of inventive concepts may include a gate stack structure 200 having conductive structures and insulation interlayer structures that are alternately stacked in a first direction x on a substrate 100, an active column 300 penetrating through the gate stack structure 200 to the substrate 100 and providing an active region of the memory device 1000, a charge trap structure 400 interposed between the gate stack structure 200 and the active column 300 and selectively trapping the charges, a bit line structure 500 contact with the active column 300 and a source line structure 700 making contact with the substrate 100. A linear separation trench ST may extend in a third direction z and the neighboring gate stack structures 200 may be separated from each other by the separation trench ST and the source line structure 700 may penetrate through the separation trench ST.

The substrate 100 may include a semiconductor substrate such as a silicon substrate, a silicon-germanium substrate and a silicon-on-insulator (SOI) substrate. The silicon layer of the SOI substrate may include a single crystalline silicon layer or a polysilicon layer.

The separation trench ST may be shaped into a line extending in the third direction z, so the gate stack structure 200 may be shaped into a line extending in the third direction z and a number of the gate stack structures 200 may be spaced apart from one another by the same gap distance in a second direction y.

A first insulation pattern 221 may be interposed between the substrate 100 and the gate stack structure 200 and the conductive structures 210 and the insulation interlayer structures 220 may be alternately stacked on the first insulation pattern 221 in the first direction x.

The conductive structures 210 may be shaped into a line extending in the third direction z and may be spaced apart by the width of the separation trench ST in the second direction y. For example, the conductive structure 210 may comprise low resistive materials. Examples of the low resistive material may include doped silicon, a low resistive metal such as tungsten (W), titanium (Ti), tantalum (Ta) and platinum (Pt), a metal nitride of the low resistive metal, a metal silicide of the low resistive metal, etc. These may be used alone or in combinations thereof. A barrier layer (not shown) may be further provided with the conductive structure 210. The conductive structure 210 may be provided as a gate electrode of the vertical memory device 1000.

In some example embodiments, the conductive structure 210 may include first to sixth gate electrodes 211 to 216 that may be stacked on the first insulation pattern 221. However, more or fewer gate electrodes may be stacked on the first insulation pattern 221 according to the characteristics and configurations of the vertical memory device 1000.

The insulation interlayer structure 220 may be stacked on the first insulation pattern 221 alternately with the gate electrodes 211 to 216, so the gate electrodes 211 to 216 may be electrically insulated from one another. Thus, the insulation interlayer structure 220 may include second to sixth insulation patterns 222 to 226 corresponding to the number of the gate electrodes. For example, the insulation interlayer structure 220 may comprise an insulation material such as silicon oxide ($SiO_2$). Accordingly, a cell region C1 and an inter-cell region C2 may be alternately arranged along the gate stack structure 200 in the first direction x.

A thickness of each insulation pattern may be varied according to the device design of the vertical memory device 1000. Particularly, the thickness of the first insulation pattern 221 may smaller than those of the second to sixth insulation patterns 222 to 226.

The active column 300 may penetrate through the gate stack structure 200 and may extend in the first direction x to the substrate 100. A plurality of the active columns 300 may be arranged in the third direction z.

For example, a channel hole H (or a plurality of channel holes H) may be formed through the conductive structure 210 and the insulation interlayer structure 220 in such a way that the substrate 100) may be exposed through the channel hole H and the active column 300 may be filled up in the channel hole H. Thus, a bottom surface of the active column 300 may make contact with the substrate 100 and top surface of the active column 300 may make contact with the bit line structure 500. A contact pad 390 may be provided around an upper portion of the active column 300 and a bit line plug 510 of the bit line structure 500 may be contact with the contact pad 390, thereby reducing the contact resistance between the active column 300 and the bit line structure 500.

The active column 300 may include a semiconductor layer 310 on a sidewall of the channel hole H. The semiconductor layer 310 may function as an active region of the vertical memory device 1000. In some example embodiments, the semiconductor layer 310 may include a cylindrical pattern 312 in the channel hole H and a spacer layer 311 interposed between the cylindrical pattern 312 and the charge trap structure 400 that may be described in detail hereinafter. Thus, the spacer layer 311 may function as a spacer for separating the cylindrical pattern 312 and the charge trap structure 400 and the cylindrical pattern 312 may function as the active region of the memory device 1000. That is, the active column 300 may be a vertical active region of the vertical memory device 1000 that may be substantially perpendicular to the substrate 100.

An insulative filler 380 comprising silicon oxide (and/or other insulating material) may be filled in the cylindrical pattern 312 of the active column 300. Otherwise, the active column 300 may include a semiconductor rod or shaft without an inner space therein, so no insulative filer may be needed to the active column 300.

An upper portion of the channel hole H may be covered with the contact pad 390. Thus, a first portion of the semiconductor layer 310 contacting with the contact pad 390 may function as a drain junction of the memory device 1000 and a second portion of the semiconductor layer 310 around with the conductive structures 210 may function as a channel layer of the memory device 1000. That is, the active column 300 may function as a channel structure for each gate electrode or an individual cell of the vertical memory device 1000. For that reason, the active column 300 may be referred to as a channel structure sometimes.

The charge trap structure 400 may be provided between the active column or the channel structure 300 and the gate stack structure 200, and charges may be trapped in the charge trap structure 400. That is, the electronic data may be stored at the charge trap structure 400 in the vertical memory device 1000.

For example, the charge trap structure 400 may include a block pattern 410 making contact with the gate stack structure 200 in the first direction x, a tunnel insulation pattern 430 shaped into a cylinder that encloses that channel structure 300 and making contact with the channel structure 300 and a charge trap pattern 420 having a plurality of traps for storing the charges and interposed between the block pattern 410 and the tunnel insulation pattern 430.

The block pattern 410 may comprise dielectric materials having a high dielectric constant and may include a single layer such as a high-k layer or a multilayer in which a number of insulation layers may be stacked. For example, the high-k layer may comprise any one of silicon oxide, hafnium oxide, aluminum oxide and in combinations thereof.

The charge trap pattern 420 may be at least partially contact the block pattern 410 in such a way that the charge trap pattern 420 may continuously or discontinuously extend in the first direction x. The electronic data may be programmed by trapping the charges into the charge trap pattern 420 and may be erased by removing the charges from the charge trap pattern 420, so that the data state of each cell of the vertical memory device 1000 may be varied by the charge trap at the charge trap pattern 420.

In some example embodiments, the charge trap pattern 420 may include a first pattern 421 covering the block pattern 410 and a second pattern 422 covering the tunnel insulation pattern 430 and may extend in the first direction. Particularly, the first and the second patterns 421 and 422 may be combined with each other in the cell region C1 around each of the gate electrodes 211 to 216 and the charge trap pattern 420 may be provided as a single combined pattern in the cell region C1. In contrast, the first and the second patterns 421 and 422 may be separated from each other in the inter-cell region C2 around each of the insulation patterns 221 to 226 and the charge trap pattern 420 may be provided as a separated pattern in the inter-cell region C2. Thus, the charge trap pattern 420 may have a large relatively pattern thickness in the cell region C1, so the density of the charge trap may increase in the cell region C1 rather than the inter-cell region C2. In addition, an anti-coupling pattern 425, which may reduce the coupling between the neighboring stack cells adjacent to each other in the first direction x, may be interposed between the separated first and the second patterns 421 and 422 in the inter-cell region. That is, the charge trap pattern 420 may have an increased thickness in the cell region C1, and may contain the anti-coupling structure 425 therein in the inter-cell region C2 in such a configuration that the anti-coupling structure 425 may be enclosed by the first and the second patterns 421 and 422.

The compositions of the first and the second patterns 421 and 422 may be selected in view of the trap density of the charge trap pattern 420. For example, the first pattern 421 may comprise silicon nitride and the second pattern 422 silicon oxynitride. Otherwise, the first and the second patterns 421 and 422 may comprise silicon nitride or silicon oxynitride.

The insulation interlayer structure 220 may be recessed to a depth d in the second direction y, so an inter-cell recess R may be provided between the neighboring conductive structures 210. Thus, the inter-cell recess R may be defined by a pair of the neighboring conductive structures 210 and the insulation interlayer structure 220 interposed between the pair of the neighboring conductive structures 210.

In some example embodiments, the block pattern 410 and the first pattern 421 may continuously extend in the first direction x and may be recessed into the inter-cell recess R conformal with a surface profile of the inter-cell recess R.

For example, the first pattern 421 may include a vertical portion 421a extending along the first direction x in parallel with a sidewall of the conductive structure 210 in the cell region C1, a horizontal portion 421b extending in a second direction y substantially perpendicular to the first direction x and in parallel with one of top and bottom surfaces of the conductive structures 210 in the inter-cell recess C2 and a connection portion 421c connected with the vertical and horizontal portions 421a and 421b. Thus, the first pattern 421 may include an indent portion I that may be indented into the inter-cell recess R.

In contrast, the second pattern 422 may include a linear pattern continuously extending in the first direction x. The second pattern 422 may contact the vertical portion 421a of the first pattern 421 in the cell region C1 and may be separated from the first pattern 421 by the anti-coupling structure 425 that may be enclosed by the second pattern 422 and the horizontal portion 421b and the connection portion 421c of the first pattern 421 in the inter-cell region C2.

Therefore, the first and the second patterns 421 and 422 of the charge trap pattern 420 may be combined into the single combined pattern 420a in the cell region C1 and may be separated into a separated pattern 420b in the inter-cell region C2.

Since the combined pattern 420a may have a thickness greater than the first or the second pattern 421 or 422, the trap density of the charge trap pattern 420 may be improved as compared with when the first or the second pattern 421 or 422 may be solely arranged in the cell region C1. Therefore, the programming voltage and the erasing voltage of the vertical memory device 1000 may be controlled substantially constant or uniform even though the vertical memory device 1000 may be downsized and the height of the charge trap pattern 420 may decrease in the cell region C1. That is, the memory window size of the vertical memory device 1000 may be substantially unchanged in spite of the size reduction of the vertical memory device 1000. Therefore, reliability deterioration of the vertical memory device 1000 may be sufficiently reduced and/or prevented from in spite of the size reduction thereof. In some example embodiments, the combined pattern 420a may have a thickness that may be about 1.5 to 2 times the thickness of the first pattern 421.

Since the first and the second patterns 421 and 422 may be separated from each other in the second direction y as the separated pattern 420b in the inter-cell region C2, the anti-coupling structure 425 may be contained in an isolated area between the first and the second patterns 421 and 422. Thus, the anti-coupling structure 425 may be enclosed by the linear second pattern 422 and the indent portion I of the first pattern 421. Particularly, the anti-coupling structure 425 may comprise an insulation material of which the dielectric constant may be smaller than the specific dielectric constant of the first and the second patterns 421 and 422, so that the coupling between the neighboring stack cells may be sufficiently reduced, minimized, or prevented. For example, the anti-coupling structure 425 may include an oxide layer.

In some example embodiments, the anti-coupling structure 425 may also be indented into the inter-cell recess R from a central portion of the charge trap pattern 420 conformal with a surface profile of the inter-cell recess R.

That is, the inter-cell recess R, which may be defined by the block pattern 410 and the horizontal pattern 421b and the connection portion 421c of the first pattern 421, may be filled up with the anti-coupling structure 425. For example, a pair of the horizontal patterns 421b in the inter-cell recess R may be spaced apart by a gap distance of about 2 nm to about 3 nm, so the anti-coupling structure 425 may have a width of about 2 nm to about 3 nm.

In contrast, the charge trap pattern 420 may have a smaller thickness in the inter-cell region C2 than in the cell region C1 due to the separation of the first and the second patterns 421 and 422, thereby reducing the charge mobility via the separated pattern 420b. In addition, the first pattern 421 may be elongated in the inter-cell region C2 as long as the horizontal portion 421b and the connection portion 421c, so the electron path may also increase between the neighboring stack cells in the inter-cell region C2. Accordingly, the charges trapped in the combined pattern 420a in a cell region may be sufficiently reduced and/or prevented from being diffused to the combined pattern 420a in the next cell region. That is, the electron diffusion between the neighboring stack cells may be sufficiently minimized in the vertical memory device 1000.

Further, since the anti-coupling structure 425 may be arranged between the isolation area between the first and the second patterns 421 and 422 in the inter-cell region C2, the coupling between the neighboring stack cells may be sufficiently reduced and/or minimized. Particularly, the anti-coupling structure 425 may be indented into the inter-cell recess R and may be interposed between a pair of the gate electrodes of the conductive structure 210. That is, the insulation materials having a dielectric constant smaller than that of the charge trap pattern 420 may be filled between the neighboring gate electrodes, so the neighboring gate electrodes may be sufficiently insulated from each other even when the vertical memory device 1000 may be downsized.

Therefore, the electron diffusion between the neighboring stack cells may be reduced and/or minimized by the indent portion I of the first pattern and the neighboring stack cells may be sufficiently insulated from each other by the anti-coupling structure 425. Accordingly, the charge density may increase in the cell region C1 and the electrical insulation between the neighboring stack cells may be sufficiently improved in the vertical memory device 1000.

The tunnel insulation pattern 430 may be direct contact with the channel structure 300 and may be shaped into a hollow shaft extending in the first direction x. For example, the tunnel insulation pattern 430 may comprise an oxide such as silicon oxide.

In some example embodiments, the gate electrodes 211 to 216 of the gate stack structure 200 may be connected in series with the bit line structure 500 and the source line structure 700, thereby constituting a cell string of a NAND flash memory device. In such a case, the vertical memory device 1000 may be provided as a vertical NAND flash memory device. The cell string of the flash memory device may include a string selection transistor (SST), a ground selection transistor (GST) and a plurality of cell transistors (MCT). The SST, GST and MCTs may be provided with a single active column 300.

In some example embodiments, the gate stack structure 200 may include a three-dimensional (3D) memory array that includes three-dimensionally arranged memory cells, a plurality of word lines electrically connected to the memory cells, and a plurality of bit lines electrically connected to the memory cells. The 3D memory array may be monolithically formed on a substrate (e.g., semiconductor substrate such as silicon, or semiconductor-on-insulator substrate). The 3D memory array may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pal Pub. No. 2011/0233648.

The first gate electrode 211 may be provide as a gate electrode of the GST and the second to fifth gate electrodes 212 to 215 may be provided as gate electrodes of the MCTs. The sixth gate electrode 216 may be provided as a gate electrode of the SST.

The bit line structure 500 may include a bit line plug 510 making contact with the contact pad 390 at the upper portion of the active column 300 and a bit line 520 making contact with the bit line plug 510 and extending in the second direction y.

A common source CS may be provided as a bottom of the separation trench ST. Thus, a plurality of the common sources CS each of which may extend in the third direction z may be spaced apart by the same gap distance in the second direction y. Some impurities may be implanted onto the common source CS and a source junction may be provided with the common source CS.

A trench pattern 600 may be filled up in the separation trench ST and may include an insulation spacer 610 and a device isolation pattern 620. The insulation spacer 610 may cover the sidewall of the gate stack structure 200 in the first direction x and may comprise any one material of silicon oxide, silicon nitride, silicon oxynitride, aluminum oxide and in combinations thereof. The device isolation pattern 620 may fill up the separation trench ST of which the sidewall may be covered with the insulation spacer 610.

A source interconnector 710 may be connected to the common source CS through the device isolation pattern 620 and a source line 720 extending in the third direction z may be connected to the source interconnector 710. A common source line CSL extending in the second direction y may be connected to a plurality of source lines 720 via source contacts 721.

The source interconnector 710 may include a source plug 711 and a source barrier layer 712 enclosing the source plug 711, and a plurality of the source interconnectors 710 may be arranged in the third direction z.

The bit line 520 may be arranged over the source line 720 and may extend in the second direction y in parallel with the common source line CSL.

According to the vertical memory device of inventive concepts, the charge trap pattern 420, which may continuously extend in the first direction x alternately across the cell region C1 and the inter-cell region C2, may include a single combined pattern 420a in the cell region C1 and a separated pattern 420b in the inter-cell region C2. The combined pattern 420a may have a relatively larger thickness and the separated pattern 420b may have a relatively smaller thickness and containing the anti-coupling structure 425 therein. In addition, the anti-coupling structure 425 may be indented into the inter-cell recess R, so the neighboring gate electrodes of the conductive structure 210 may be sufficiently insulated from each other by the anti-coupling structure 425. Accordingly, the charge density may increase in the cell region C1 due to the configuration of the charge trap pattern 420 and the coupling between the neighboring stack cells may be sufficiently limited and/or prevented due to the anti-coupling structure 425 in the vertical memory device 1000.

Figure 5:
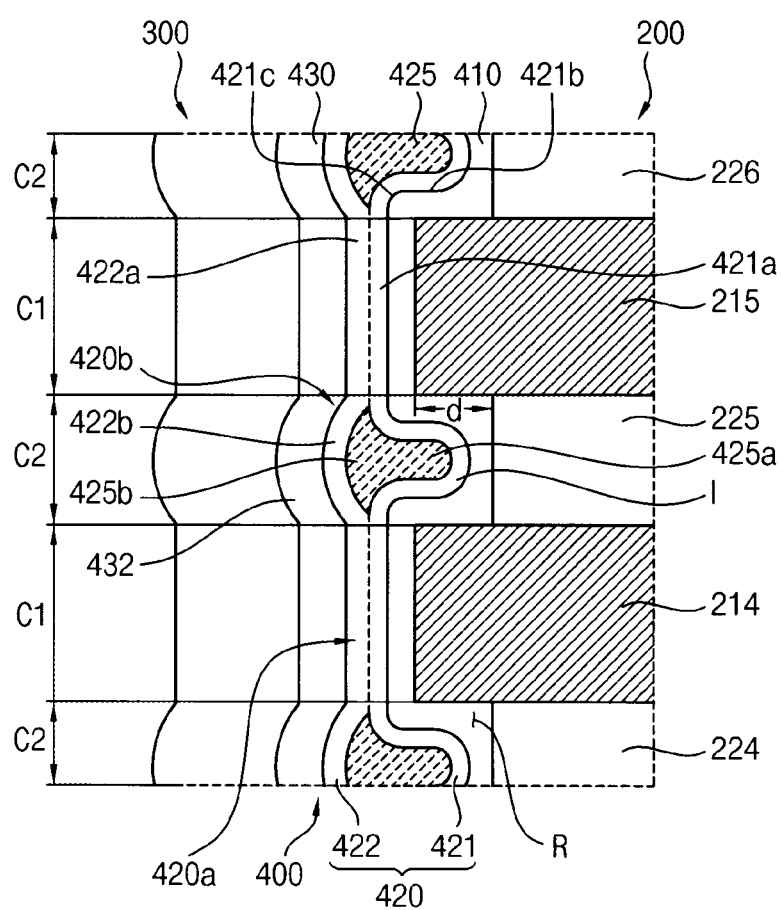
FIG. 5 is a cross sectional view illustrating a first modification of the charge trap structure shown in FIG. 4.

FIG. 5 is a cross sectional view illustrating a first modification of the charge trap structure shown in FIG. 4. In FIG. 5, the charge trap structure 400 may have substantially the same configurations as the charge trap structure shown in FIG. 4, except that the second pattern of the charge trap pattern 420 may include a non-linear pattern. Thus, the same reference numerals in FIG. 5 denote the same elements in FIG. 4, and any further detailed descriptions on the same elements will be omitted.

Referring to FIG. 5, the second pattern 422 may include a linear portion 422a making contact with the vertical portion 421a of the first pattern 421 in the cell region C1 and a convex portion 422b connected to the linear portion 422a and swelled toward the channel structure 300 in the inter-cell region C2 such that the anti-coupling structure 425 may be enclosed by the convex portion 422b of the second pattern 422 and the horizontal portion 421b and the connection portion 421c of the first pattern 421.

For example, the anti-coupling structure 425 may be indented into the inter-cell recess R and may make contact with the indent portion I of the first pattern 421 and may also be protruded or swelled toward the channel structure 300, and the second pattern 422 may be contact with the vertical portion 421a of the first pattern 421 in the cell region C1 and may be contact with the anti-coupling structure 425 conformal with a swelled area of the anti-coupling structure 425. For example, the anti-coupling structure 425 may comprise silicon oxide and the second pattern 422 may comprise silicon nitride.

That is, the anti-coupling structure 425 may include an indent portion 425a that may be indented into the inter-cell recess R from a central portion of the charge trap pattern 420 and a protrusion portion 425b that may be protruded toward the channel structure 300 from the central portion of the charge trap pattern 420 conformal with a shape of the convex portion 422b of the second pattern 422.

For example, residual polysilicon in the inter-cell recess R may be swelled in an oxidation process and the volume of the residual polysilicon may expand over the inter-cell recess, thereby forming a silicon oxide pattern that may be swelled and protruded from the inter-cell recess as the anti-coupling structure 425. That is, the anti-coupling structure 425 may have the protrusion portion 425b that may be protruded toward the active column 300 from a side surface of the first pattern 421.

Since the silicon oxide pattern may be arranged just in the inter-cell region C2, the second pattern 422 may be configured into a linear pattern making contact with the vertical portion 421a of the first pattern 421 in the cell region C1 and may be configured into a curved pattern making contact with the swelled anti-coupling structure 425 in the inter-cell region C2. Thus, the second pattern 422 may be provided as a non-linear pattern having the linear portion 422a in the cell region C1 and the convex portion 422b in the inter-cell region C2, so the charge trap pattern 420 may be configured into the single combined pattern 420a and be configured into the separated pattern 420b in the inter-cell region C2. The silicon oxide pattern enclosed by the first and the second patterns 421 and 422 may be controlled in the oxidation process such that the dielectric constant of the silicon oxide pattern may be smaller than those of the first and the second patterns 421 and 422.

The silicon oxide pattern in the inter-cell region C1 may be indented into the inter-cell recess R, so the neighboring stack gate electrodes of the conductive structure 210 may be sufficiently insulated from each other, thereby limiting and/or preventing the coupling between the neighboring stack cells. That is, the swelled silicon oxide pattern in the inter-cell region C2 may be provided as the anti-coupling structure 425.

Particularly, since the second pattern 422 may be changed into a curvilinear pattern from a linear pattern in the inter-cell region, the electron path via the second pattern 422 may also be elongated and as a result, the electron diffusion between the neighboring stack cells may be reduced and/or minimized. In addition, the anti-coupling structure 425 may be upsized as much as the protrusion portion 425b, the electrical coupling may also be reduced and/or prevented between the neighboring conductive structures 210.

Since the tunnel insulation pattern 430 and the channel structure 300 may be formed after formation of the charge trap pattern 420 in the manufacturing process, the tunnel insulation pattern 430 and the active column 300 may also be swelled or protruded conformal with the convex portion 422b of the second pattern 422.

When the convex portion 422b of the second pattern 422 may be excessively swelled or protruded, an excessive stepped portion may be arranged on the sidewall of the channel hole H in the first direction x. The excessive stepped portion of the channel hole H may deteriorate coverage characteristics of layers for the tunnel insulation pattern 430 and the active column 300). Since the size of the convex portion 422b of the second pattern 422 may be determined by the size of the protrusion portion 425b of the anti-coupling structure 425, the protrusion portion 425b of the anti-coupling structure 425 may be controlled in such a way that the convex portion 422b of the second pattern 422 may be within an allowable range in view of the coverage characteristics.

Particularly, the size of the protrusion portion 425b may be varied by the size of the inter-cell recess R. In addition, the tunnel insulation pattern 430 has a swelling portion 432 that may be swelled toward the channel structure 300 corresponding to the protrusion portion 425b of the anti-coupling structure 425.

In some example embodiments, each insulation pattern of the insulation interlayer structure 220 may have a height of about 18 nm to about 20 nm and the block pattern 410 may have a thickness of about 5 nm to about 7 nm. In addition, the first pattern 421 may have a thickness of about 2 nm to about 3 nm and the inter-cell recess R may have a depth d of about 15 nm to about 20 nm.

When the depth d of the inter-cell recess R may be less than about 15 nm, the horizontal portion 421b of first pattern 421 may be so short that the electron path via the first pattern 421 may not be sufficient for reducing and/or preventing the electron diffusion. In contrast, when the depth d of the inter-cell recess R may be more than about 20 nm, the convex portion 422b of the second pattern 422 may be so much swelled or protruded that the coverage characteristics of layers for the tunnel insulation pattern 430 and the active column 300 may be deteriorated in a subsequent deposition process.

For those reasons, the inter-cell recess R may have the depth d of about 15 nm to about 20 nm. The depth d of the inter-cell recess R may be varied according to the height of the insulation interlayer structure 220, a diameter of the channel hole H and the thicknesses of the block pattern 410 and the first pattern 421.

Accordingly, the electron path via the second pattern 422 may be elongated and the size of the anti-coupling structure 425 may increase, so that the electron diffusion between the neighboring stack cells may be reduced and/or minimized and the coupling between the neighboring stack cells may be sufficiently reduced and/or prevented in the vertical memory device 1000.

Figure 6:
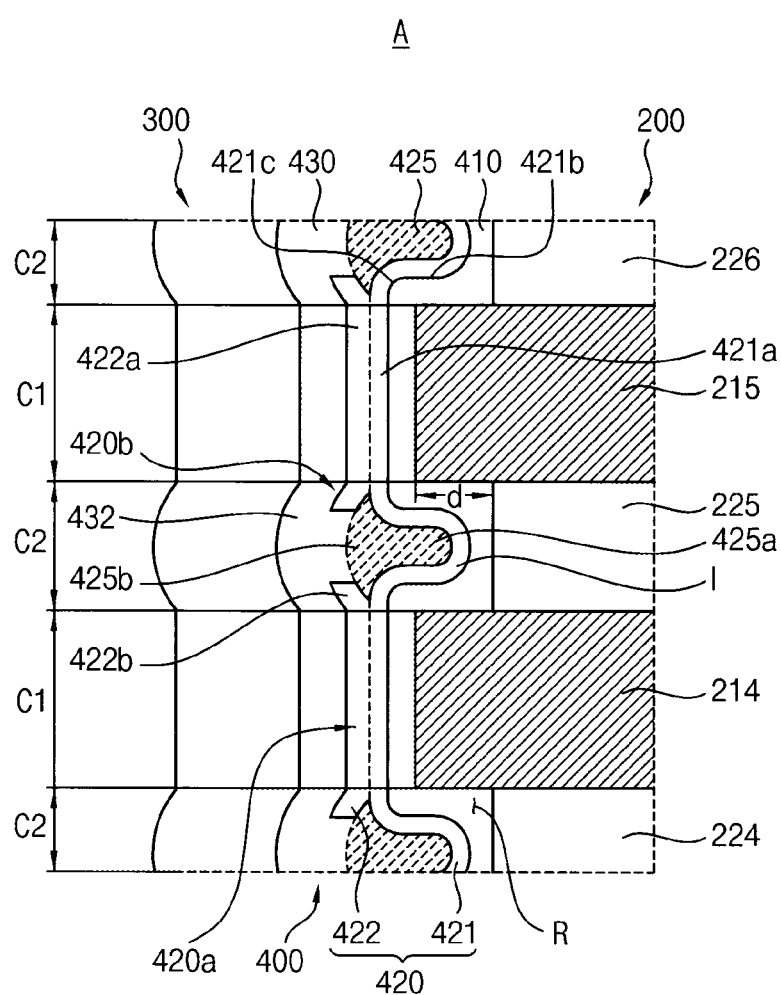
FIG. 6 is a cross sectional view illustrating a second modification of the charge trap structure shown in FIG. 4.

FIG. 6 is a cross sectional view illustrating a second modification of the charge trap structure shown in FIG. 4. In FIG. 6, the charge trap structure 400 may have substantially the same configurations as the charge trap structure shown in FIG. 5, except that the second pattern may be separated and discontinuous along the first direction x in the inter-cell region C2. Thus, the same reference numerals in FIG. 6 denote the same elements in FIG. 5, and any further detailed descriptions on the same elements will be omitted.

Referring to FIG. 6, the convex portion 422b of the second pattern 422 may be partially removed from the protrusion portion of the anti-coupling portion 425b in the inter-cell region C2 and the continuous second pattern 422 may be changed into a discontinuous pattern in the first direction x.

After formation of the second pattern 422 having the linear portion 422a and the convex portion 422b, the convex portion 422b may be partially etched off from the anti-coupling structure 425 in the inter-cell region C2.

Therefore, the linear portion 422a of the second pattern 422 may remain unchanged in the cell region C1 and the convex portion 422b of the second pattern 422 may be at least intermittently remain on or fully removed from the anti-coupling structure 425 in the inter-cell region C2, so that the second pattern 422 may be discontinuous in the first direction x.

Thus, the liner portion 422a of the second pattern 422 may be in contact with the vertical portion 421a of the first pattern 421, thereby forming the single combined pattern 420a of the charge trap pattern 420 in the cell region C1, and the residual of the convex portion 422b or no convex portion 422b of the second pattern 422 may be contact with the protrusion portion 425b conformal with a swelled area of the anti-coupling structure 425 while the indent portion 425a may be contact with the first pattern 421, thereby forming the separated pattern 422b in the inter-cell region C2. The shortcut of the second pattern 422 in the inter-cell region C2 may limit and/or prevent the electron diffusion via the second pattern 422, thereby increasing the charge density in the charge trap pattern 420 in the cell region C1. Thus, the memory window size of the vertical memory device 1000 may be substantially unchanged in spite of the size reduction of the vertical memory device 1000.

Particularly, as the convex portion 422b of the second pattern 422 may be at least partially removed from the anti-coupling structure 425, the protrusion portion 425b of the anti-coupling structure 425 may be directly contact with the tunnel insulation pattern 430. In addition, the tunnel insulation pattern 430 has a swelling portion 432 that may be swelled toward the channel structure 300 corresponding to the protrusion portion 425b of the anti-coupling structure 425. In some example embodiments, the anti-coupling pattern 425 and the tunnel insulation pattern 430 may comprise the same insulation materials such as silicon oxide (SiO2).

Figure 7:
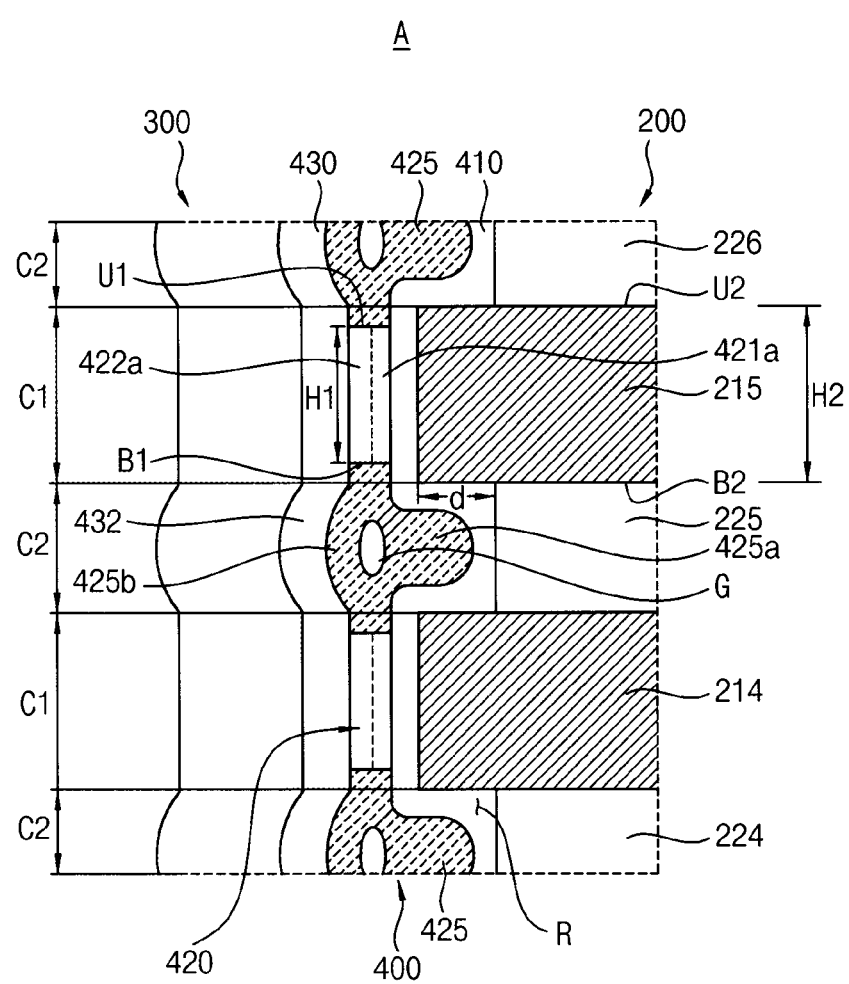
FIG. 7 is a cross sectional view illustrating a third modification of the charge trap structure shown in FIG. 4.

FIG. 7 is a cross sectional view illustrating a third modification of the charge trap structure shown in FIG. 4. In FIG. 7, the charge trap structure 400 may have substantially the same configurations as the charge trap structure shown in FIG. 6, except that the first pattern may also be separated and discontinuous along the first direction x in the inter-cell region C2 as well as the second pattern and an air gap may be provided with the anti-coupling structure. Thus, the same reference numerals in FIG. 7 denote the same elements in FIG. 6, and any further detailed descriptions on the same elements will be omitted.

Referring to FIG. 7, the charge trap pattern 420 may be interposed between the block pattern 410 and the tunnel insulation pattern 430 and may include the first pattern 421 covering the block pattern 410 and the second pattern 422 covering the tunnel insulation pattern 430 in such a configuration that the charge trap pattern 420 may be arranged only in the cell region C1 and may be discontinuously along the first direction x and that the anti-coupling pattern 425 may be enclosed by the block pattern 410 and the tunnel insulation pattern 430 in the inter-cell region C2.

For example, the horizontal portion 421b and the connection portion 421c may be etched off from the first pattern 421 shown in FIG. 6 and the vertical portion 421a may remain in the cell region C1 in such a configuration that only the block pattern 410 may be recessed into the inter-cell recess R conformal with a surface profile of the inter-cell recess R. Thus, both of the first and the second patterns 421 and 422 may be removed from the inter-cell region C2 and the vertical portion 421a of the first pattern 421a and the linear portion 422a of the second pattern 422 may be combined into the single combined pattern as the charge trap pattern 420 in the cell region C1.

Particularly, an upper surface U1 of the charge trap pattern 420 may be lower than an upper surface U2 of the corresponding conductive structure 210, e.g., a fifth gate electrode 215 and a bottom surface B1 of the charge trap pattern 420 may be higher than a bottom surface B2 of the corresponding gate electrode 215. That is, the charge trap pattern 420 may have a height H1 smaller than the height H2 of the corresponding gate electrode 215.

The anti-coupling structure 425 may have the dielectric constant smaller than that of the charge trap pattern 420 and may fill up the inter-cell region C2, thereby reducing and/or preventing the coupling between the neighboring stack cells in the first direction x. As described above, the anti-coupling structure 425 may include the indent portion 425a that may be indented into the inter-cell recess R from a central portion of the charge trap pattern 420 and the protrusion portion 425b that may be protruded toward the channel structure 430 from the central portion of the charge trap pattern 420. In addition, the tunnel insulation pattern 430 has a swelling portion 432 that may be swelled toward the channel structure 300 corresponding to the protrusion portion 425b of the anti-coupling structure 425. In some example embodiments, the anti-coupling structure 425 may comprise silicon oxide having the dielectric constant smaller than that of silicon nitride.

Particularly, the anti-coupling structure 425 may include an air gap G aligning with the central portion of the charge trap pattern 420 along the first direction x. Thus, the air gap G may be defined by the indent portion 425a and the protrusion portion 425b of the anti-coupling structure 425.

For example, the air gap G may be self-aligned with the charge trap pattern 420 along the first direction x alternately with the charge trap pattern 420 in a formation process of the indent portion 425a and the protrusion portion 425b.

Since the dielectric constant of air may be smaller than that of silicon oxide, an overall dielectric constant of the anti-coupling structure 425 having the air gap G may be smaller than the anti-coupling structure 425 without the air gap. Thus, the coupling and the electron diffusion between the neighboring stack cells may be sufficiently reduced due to high dielectric constant of the anti-coupling structure 425 having the air gap G.

Hereinafter, the method of manufacturing some example embodiments of the vertical memory devices of inventive concepts will be described in detail with reference to FIGS. 8A to 34.

FIGS. 8A, 9A, 10A, 11A, 12A, 13A, 14A, 15A, 16A, and 17A are cross-sectional views illustrating processing steps for a method of manufacturing the vertical memory device shown in FIGS. 1 to 4. FIG. 18 is a cross-sectional view illustrating a processing step for a method of manufacturing the vertical memory device shown in FIGS. 1 to 4. For brevity, the term FIGS. "8A to 17A" may be used to refer to FIGS. 8A, 9A, 10A, 11A, 12A, 13A, 14A, 15A, 16A, and 17A as a group. For brevity, the term "FIGS. "8B to 17B" may be used to refer to FIGS. 8B, 9B, 10B, 11B, 12B, 13B, 14B, 15B, 16B, and 17B as a group. For brevity, the term "FIGS. "8A to 17B" may be used to refer to FIGS. 8A, 9A, 10A, 11A, 12A, 13A, 14A, 15A, 16A, 17A, 8B, 9B, 10B, 11B, 12B, 13B, 14B, 15B, 16B, and 17B as a group. In FIGS. 8A to 17B, the capital letter 'A' in figure numbers denotes a cross-sectional view cutting the vertical memory device in line I-I' of FIG. 2, and the capital letter 'B' in figure numbers denotes an enlarged view of portion A in a corresponding figure denoted by the capital letter 'A.' In other words, FIGS. 8B to 17B are enlarged view of portion A in FIGS. 8A to 17A.

Figure 8A:
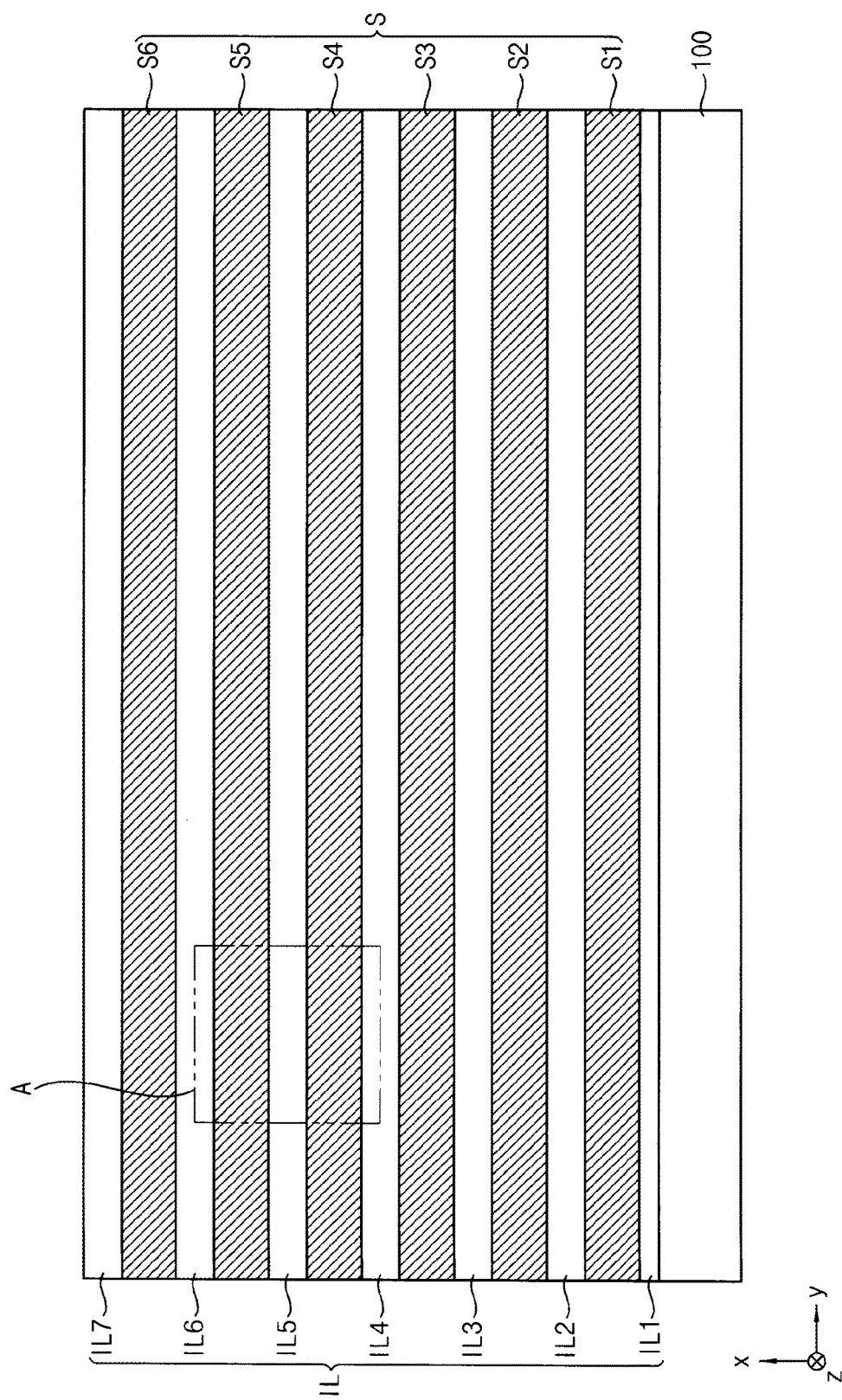
Figure 8B:
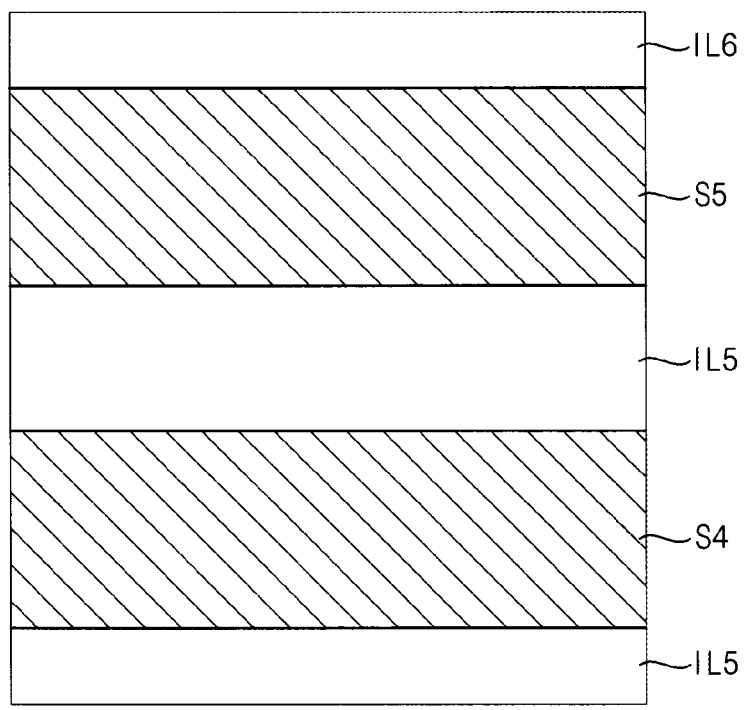

Referring to FIGS. 8A and 8B, a plurality of insulation interlayers IL1 to IL7 and a plurality of sacrificial layers S1 to S6 may be alternately stacked on a substrate 100.

For example, the first insulation interlayer IL1 may be firstly formed on the substrate 100 by a thermal oxidation process and the first to sixth sacrificial layers S1 and S6 and the second to seventh insulation layers IL2 and IL7 may be alternately stacked on the first insulation interlayer IL1 by a deposition process such as a chemical vapor deposition (CVD) process. Thus, the first insulation interlayer IL1 may function as a buffer insulation layer for subsequent processes. Particularly, the second to seventh insulation layers IL2 and IL7 may be formed to be thicker than the first insulation interlayer IL1.

The insulation interlayers IL1 to IL7 may comprise silicon oxide and the sacrificial layers S1 to S6 may comprise insulation materials having etching selectivity with respect to the insulation interlayers IL1 to IL7. For example, the sacrificial layers S1 to S6 may comprise silicon nitride. The insulation interlayers IL1 to IL7 may be formed to a thickness of about 18 nm to about 20 nm and the sacrificial layers S1 to S6 may be formed to a thickness of about 25 nm to about 30 nm.

Figure 9A:
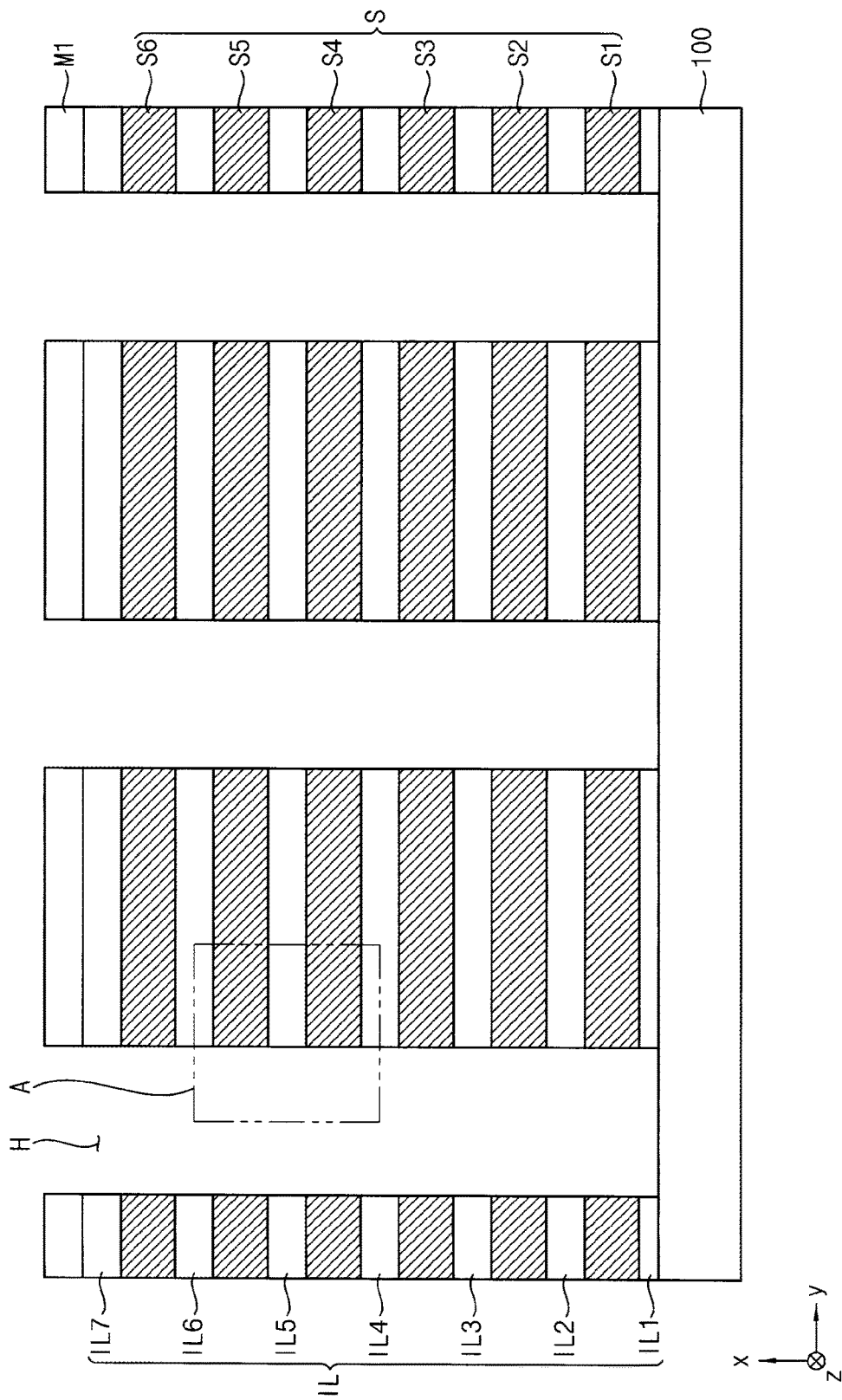
Figure 9B:
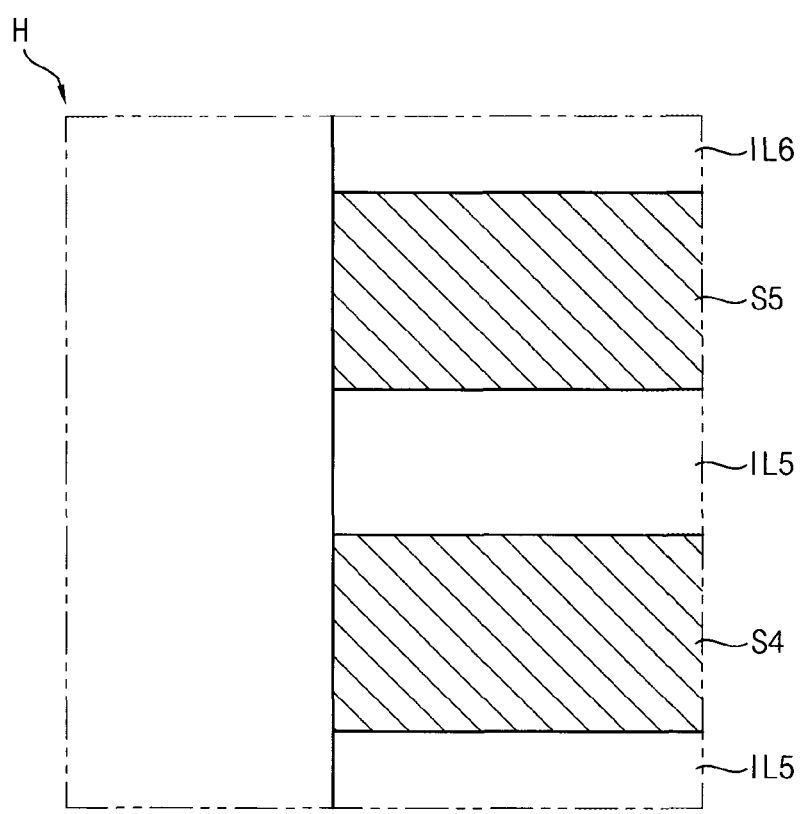

Referring to FIGS. 9A to 9B, a channel hole H may be formed through the insulation interlayers IL1 to IL7 and the sacrificial layers S1 to S6 such that the substrate 100 may be exposed through the channel hole H.

For example, a first mask pattern M1 may be formed on the seventh insulation interlayer IL7 and the insulation interlayers IL1 to IL7 and the sacrificial layers S1 to S6 may be sequentially removed from the substrate 100 by an etching process using the first mask pattern M1 as an etching mask. In some example embodiments, a plurality of the channel holes H may be arranged in a matrix shape along the second and the third directions y and z.

Figure 10A:
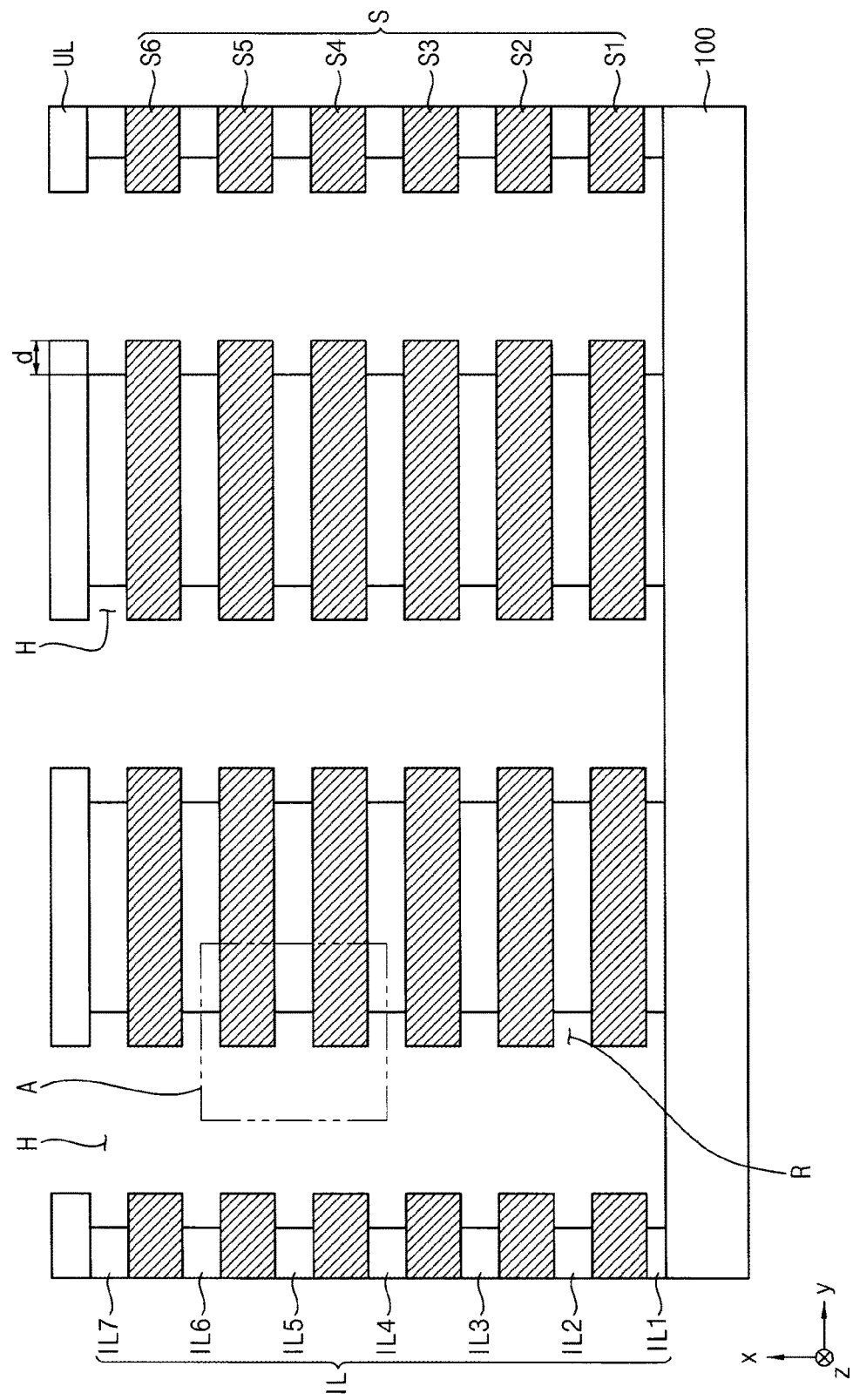
Figure 10B:
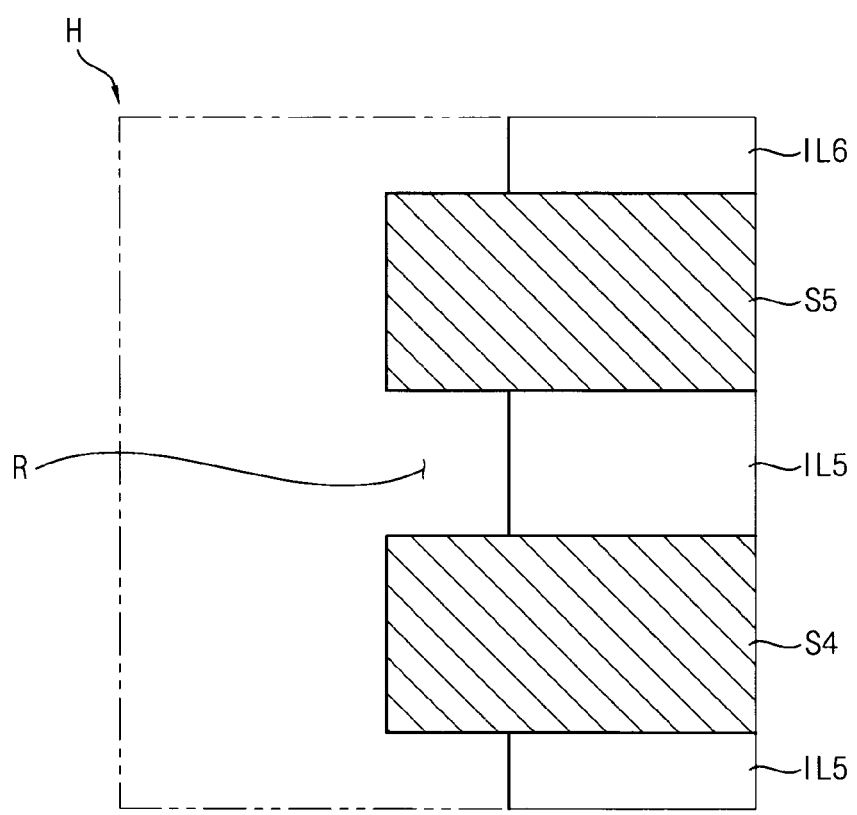

Referring to FIGS. 10A to 10B, the insulation interlayers IL1 to IL7 that may be exposed to the channel hole H may be partially removed from the corresponding sacrificial layers S1 to S6 by an etching process, thereby forming an inter-cell recess R between the vertically neighboring sacrificial layers S1 to S6.

For example, the insulation interlayers IL1 to IL7 may be etched off along the second direction y to a depth d of about 15 nm to about 20 nm from a side surface of each sacrificial layer S1 to S6 or a sidewall of the channel hole H. The depth d of the inter-cell recess R may be varied in accordance with the step coverage in a subsequent process and the elongation of electron path for reducing and/or preventing the electron diffusion.

Figure 11A:
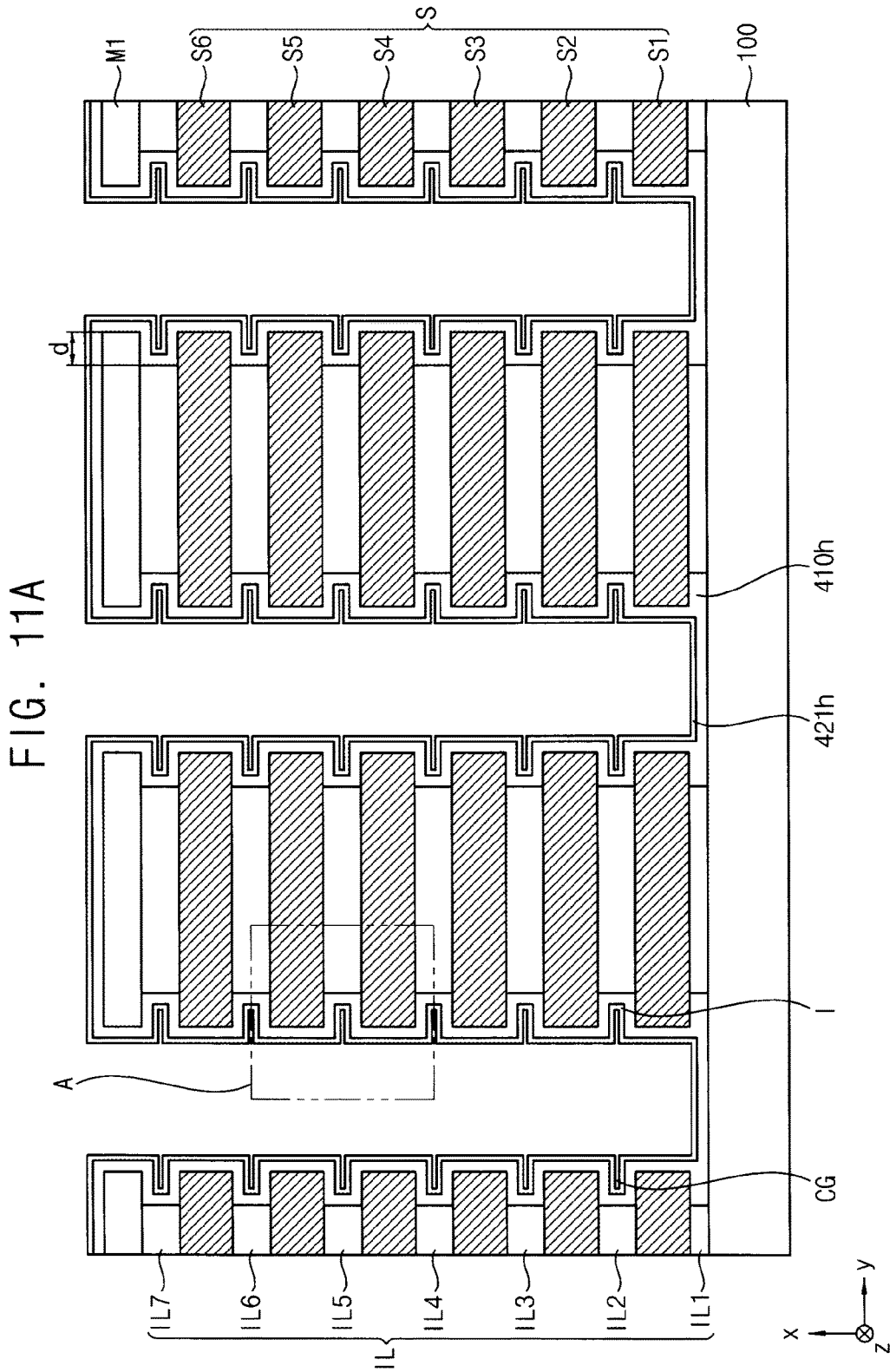
Figure 11B:
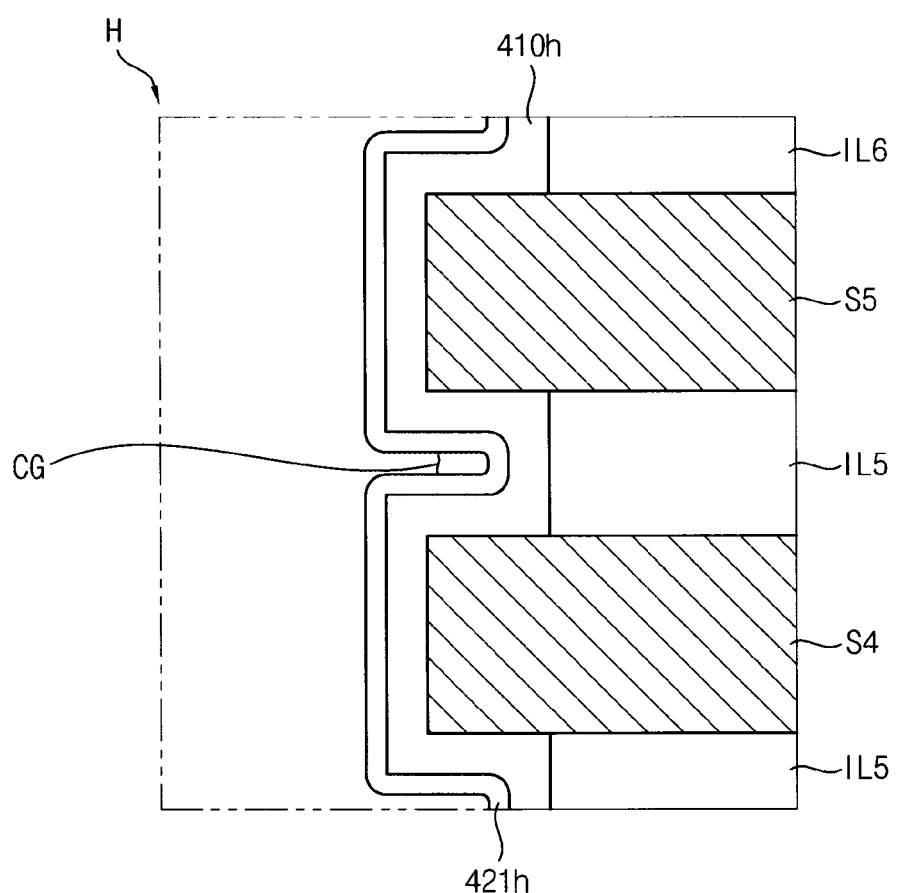

Referring to FIGS. 11A to 11B, a block layer 410h and a first trap layer 421h may be formed along a surface profile of the sidewall of the channel hole H.

The block layer 410h may include a single layer such as a high-k layer comprising aluminum oxide or hafnium oxide and a multilayer in which the high-k layer and a silicon oxide layer may be stacked. Otherwise, the block layer 410h may comprise the same insulation materials as the insulation interlayers IL1 to IL7. The first trap layer 421h may comprise silicon nitride.

The block layer 410h and the first trap layer 421h may be indented into the inter-cell recess R and an indent portion I may be formed around the reduced insulation interlayers IL1 to IL7, while the block layer 410h and the first trap layer 421h may be in parallel with the side surface of the sacrificial layers S1 to S6. Particularly, the block layer 410h and the first trap layer 421h may be formed in such a way that the inter-cell recess may not be filled with the block layer 410h and the first trap layer 421h.

Thus, the block layer 410h may be formed on a sidewall of the insulation interlayer and top and bottom surfaces of the vertically neighboring sacrificial layers in the inter-cell region R, so that the inter-cell recess R may be downsized as much as twice the thickness of the block layer 410h. In addition, the first trap layer 421h may be formed on the block layer 410h conformal with the surface profile of the inter-cell recess R, so the inter-cell recess R may be downsized again as much as twice the thickness of the first trap layer 421h.

The overall thickness of the block layer 410h and the first trap layer 421h may be smaller than half times the thickness of the insulation interlayer, so that the inter-cell recess R may be formed into a cell gap CG defined by the first trap layer 421h.

In some example embodiments, when each of the insulation interlayers IL2 to IL7 may have a thickness of about 20 nm, the block layer 410h may have a thickness of about 6 nm to about 7 nm and the first trap layer 421h may have a thickness of about 2 nm to about 3 nm. Thus, a vertical gap distance of the cell gap CG may be in a range of about 2 nm to about 4 nm.

Particularly, when the depth d of the inter-cell recess R may be in a range of about 15 nm to about 20 nm, the overall thickness of the block layer 410h and the first trap layer 421h may be about 40% to about 50% of the depth d of the inter-cell recess R. In such a case, the block layer 410h and the first trap pattern 421h may be formed into a round shape at a corner portion of each sacrificial layer S1 to S6. Accordingly, the block layer 410h and the first trap layer 421h may include the vertical portion 421a, the horizontal portion 421b and the connection portion 421c, as shown in FIG. 4.

Figure 12A:
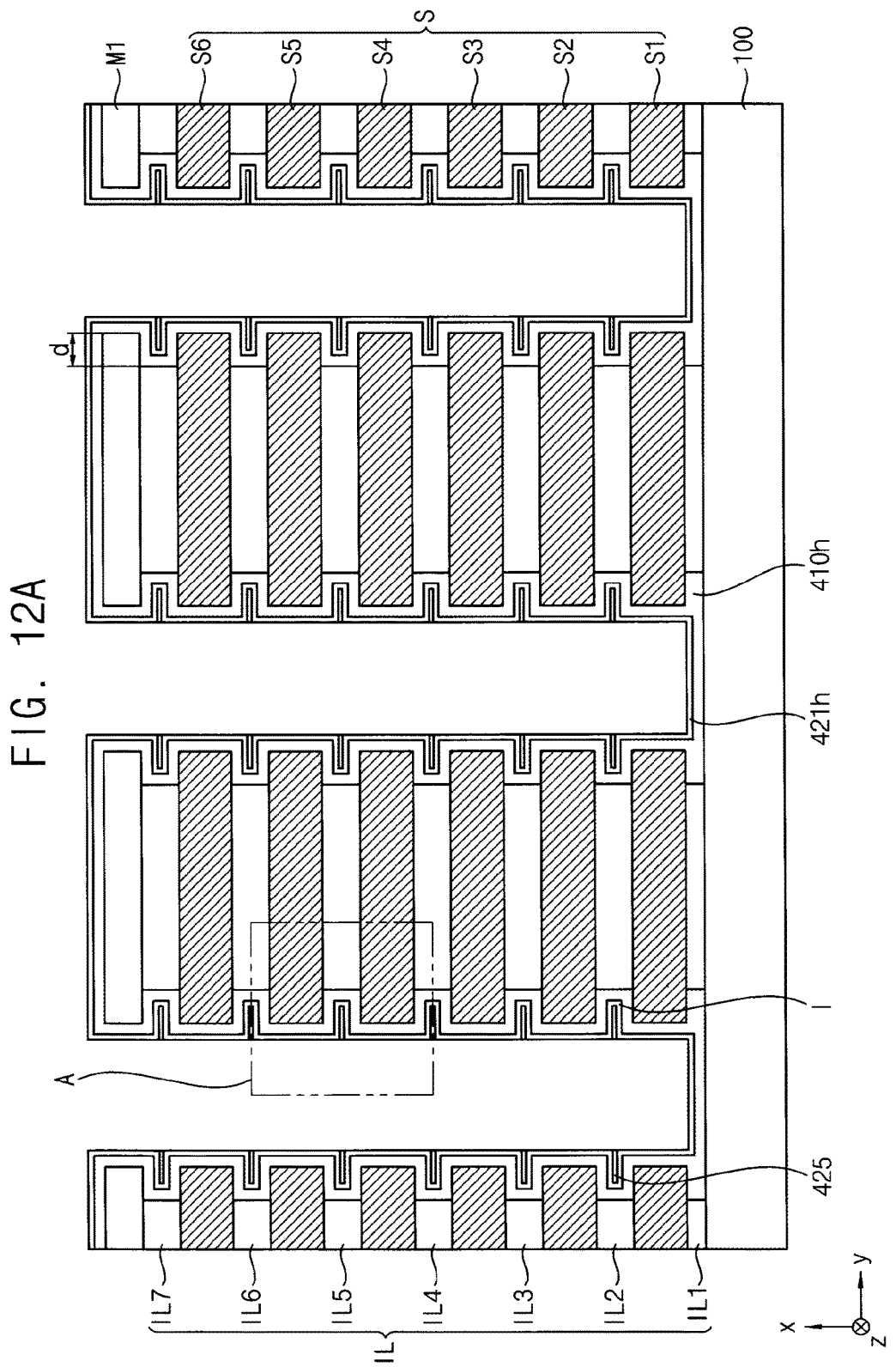
Figure 12B:
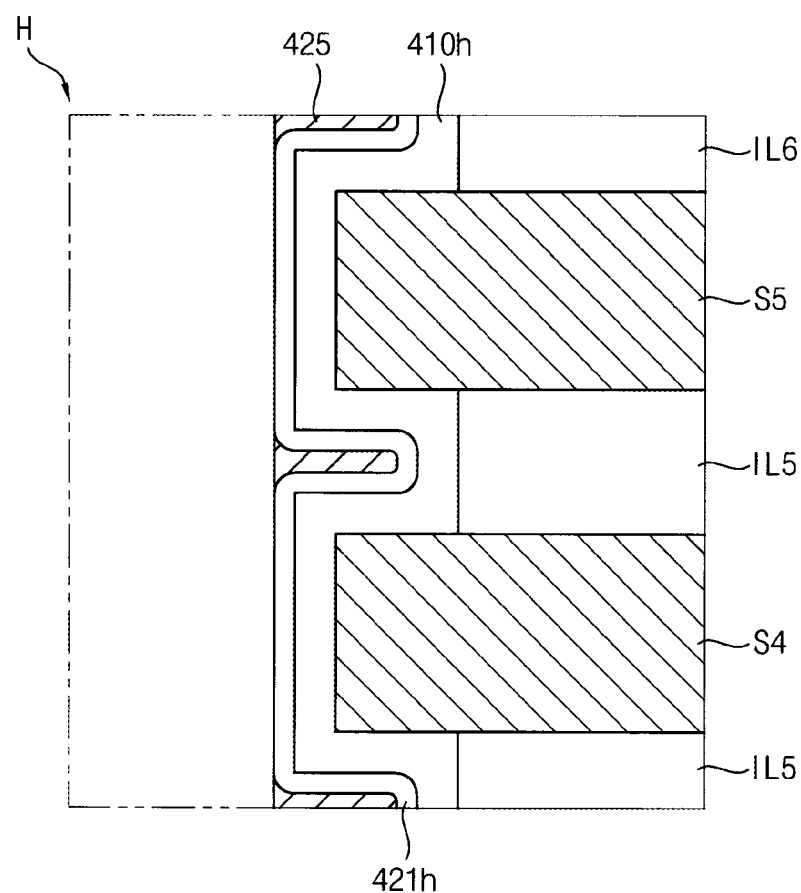

Referring to FIGS. 12A and 12B, the cell gap CG may be filled with insulation materials having a dielectric constant smaller than that of the first trap layer 421h, thereby forming an anti-coupling structure 425 as an isolated pattern between the vertically neighboring sacrificial layers. For example, the insulation material for the anti-coupling structure 425 may include silicon oxide of which the dielectric constant may be smaller than silicon nitride of the first trap layer 421h.

In some example embodiments, the channel hole H may be fill up with silicon oxide and then the silicon oxide may be removed from the channel hole H by a wet etching process or an etch-back process using the first trap layer 421h as an etch stop layer, until the vertical portion 421a of the first trap layer 421h may be exposed again to the channel hole H. Thus, the silicon oxide may just remain in the cell gap CG, thereby forming the anti-coupling structure 425 in the cell gap CG in such a configuration that a sidewall of the anti-coupling structure 425 may be coplanar with the vertical portion 421a of the first trap layer 421h.

Accordingly, the vertical portion 421a of the first trap layer 421h and the anti-coupling structure 425 may be alternately arranged in the channel hole H along the first direction x and the horizontal portion 421b and the connection portion 421c of the first trap layer 421h may be covered with the anti-coupling structure 425.

Figure 13A:
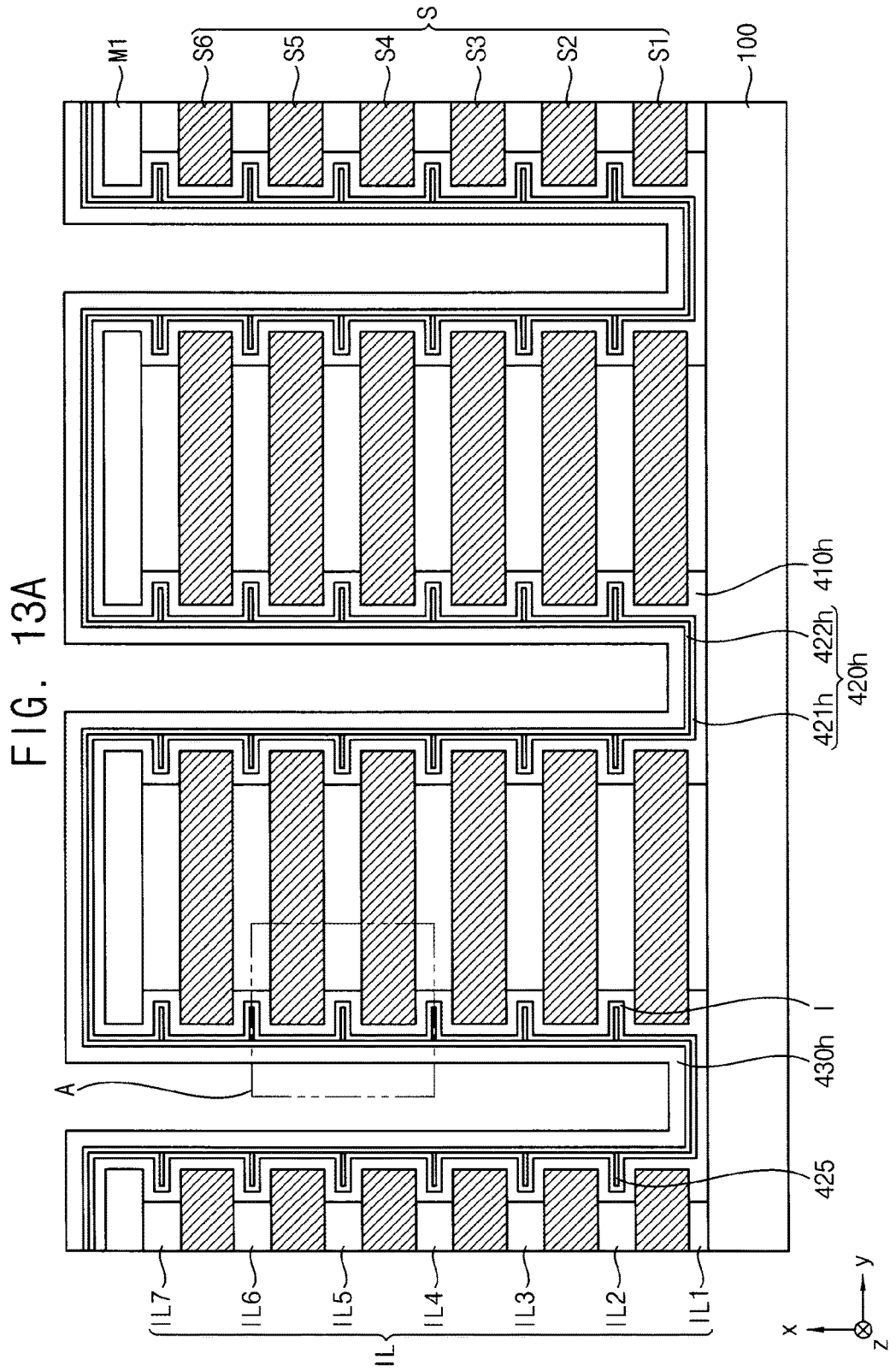
Figure 13B:
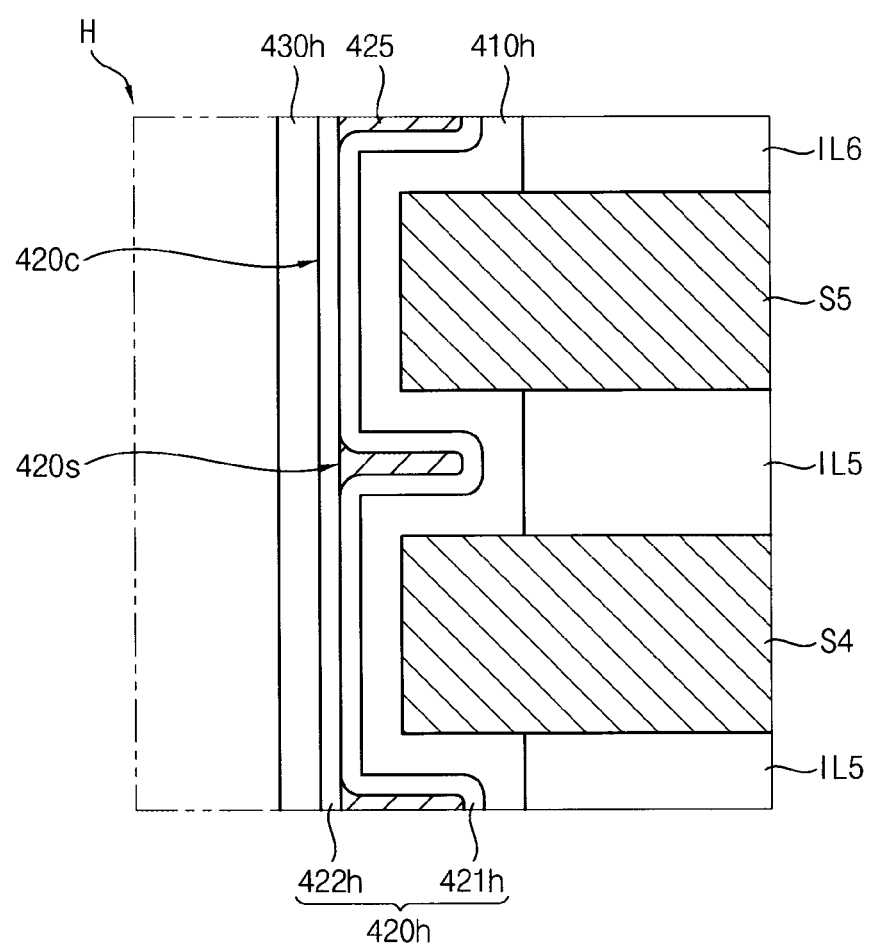

Referring to FIGS. 13A and 13B, a second trap layer 422h may be formed on the sidewall and a bottom of the channel hole H in such a way that the first trap layer 421h and the anti-coupling structure 425 may be covered by the second trap layer 422h. Then, a tunnel insulation layer 430h may be formed on the second trap layer 422h.

For example, a nitride such as silicon nitride or a silicon oxynitride may be deposited onto the sidewall and the bottom of the channel hole H by an atomic layer deposition (ALD) process, thereby forming the second trap layer 422h. Thereafter, an oxide such as silicon oxide may be deposited onto the second trap layer 422h by the ALD process, thereby forming the tunnel insulation layer 430h on the second trap layer 422h.

The second trap layer 422h and the tunnel insulation layer 430h may be formed into a continuous cylinder along the first direction x, so the central portion of the channel hole H may be defined by the cylindrical tunnel insulation layer 430h. In addition, the second trap layer 422h may be alternately contact with the first trap layer 421h and the anti-coupling structure 425 in the first direction x.

The second trap layer 422h, the first trap layer 421h and the anti-coupling structure 425 may constitute a charge trap layer structure 420h. Particularly, the first and the second trap layers 421h and 422h may be contact with each other and may be in parallel with the corresponding sacrificial layer, thereby forming a combined layer 420c around the sacrificial layers S1 to S6. In contrast, the first and the second trap layers 421h and 422h may be separated from each other by the anti-coupling structure 425 in the second direction y, thereby forming a separated layer 420s around the corresponding insulation interlayer IL2 to IL7. That is, the charge trap layer structure 420h may include the combined layer 420c around the sacrificial layers S1 to S6 and the separated layer 420s around the insulation interlayers IL2 to IL7.

Figure 14A:
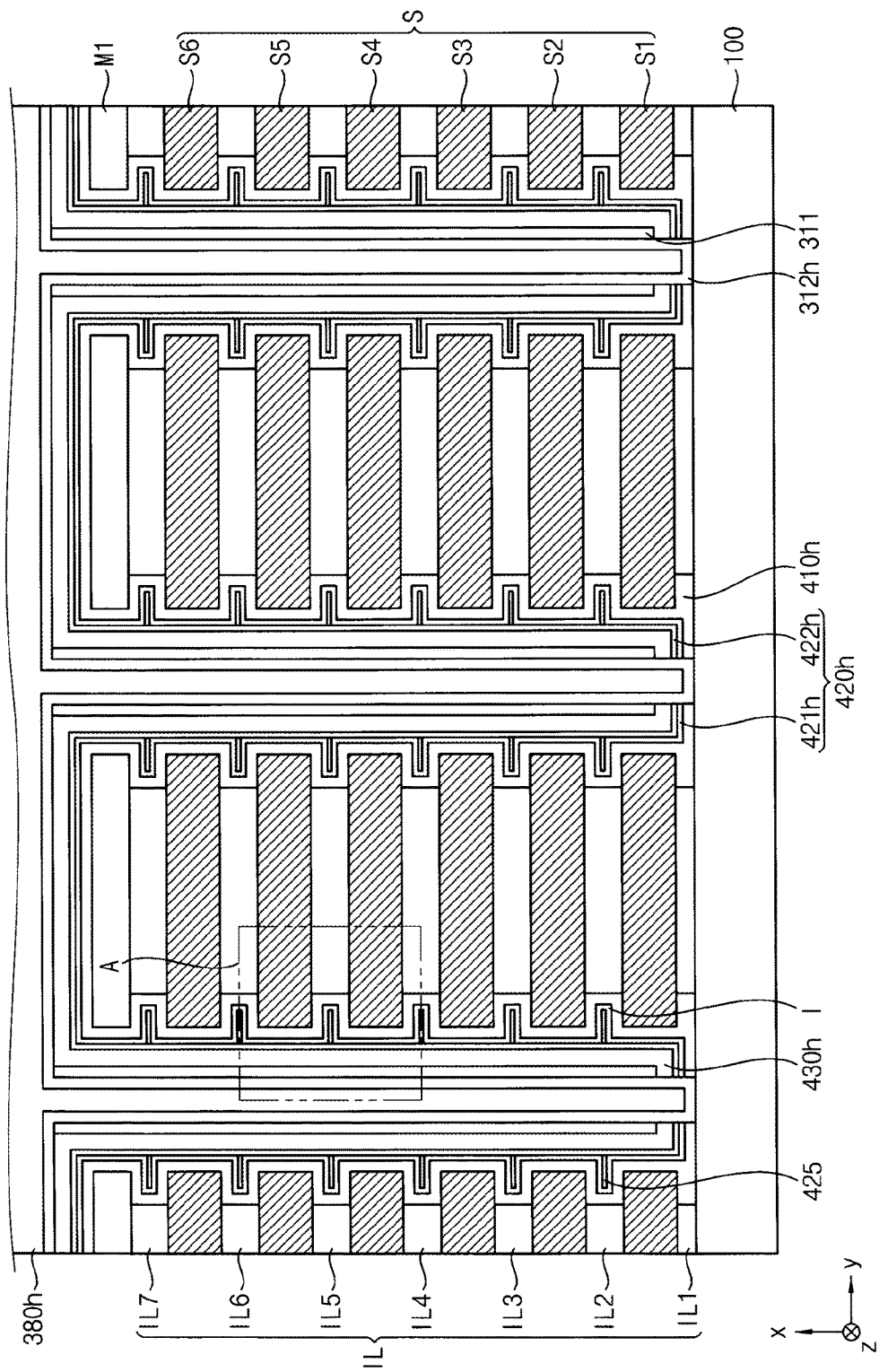
Figure 14B:
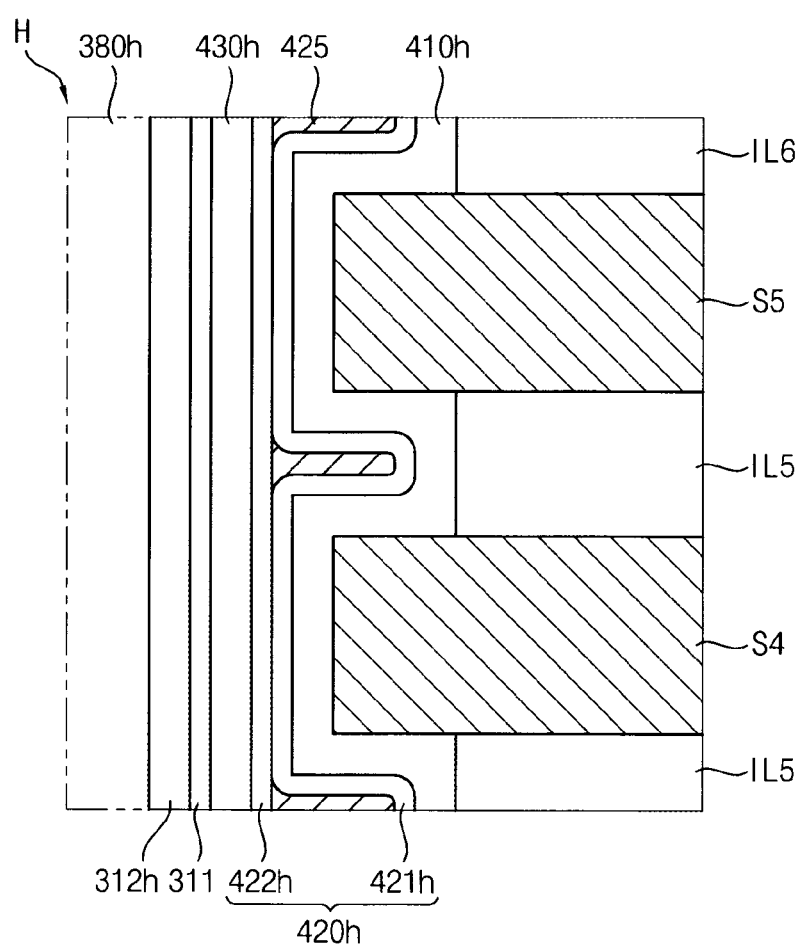

Referring to FIGS. 14A to 14B, the channel hole H may be filled up with semiconductor materials.

For example, a first semiconductor layer (not shown) may be formed on the tunnel insulation layer 430h conformal with the surface profile of the channel hole H and then the first semiconductor layer may be partially etched off by an anisotropic etching process together with the first and the second trap layers 421h and 422h on the bottom of the channel hole H, until the substrate 100 may be exposed again to the channel hole H. Thus, the first semiconductor layer may be formed into a semiconductor spacer 311 extending in the first direction x and the substrate 100 may be exposed again through the channel hole H that may be defined by the semiconductor spacer 311.

Then, a semiconductor layer 312h may be formed along a surface profile of the channel hole H defined by the semiconductor spacer 311 by a deposition process. For example, an amorphous silicon layer (not shown) may be formed on the semiconductor spacer 311 and on the substrate 100 that may be exposed through the channel hole H by a CVD process or an ALD process and then a thermal treatment may be performed to the amorphous silicon layer, thereby forming a crystalline silicon layer along a surface profile of the channel hole H as the semiconductor layer 312h. The semiconductor layer 312h may be shaped into a cylinder extending in the first direction x in the channel hole H and may function as a channel layer for the vertical memory device 1000.

Thereafter, a filling layer 380h may be formed on the semiconductor layer 312h to a sufficient thickness to fill up the channel hole H defined by the cylindrical semiconductor layer 312h. Therefore, the channel hole H may be fully filled up by the block layer 410h, the charge trap layer 420h, the tunnel insulation layer 430h, the semiconductor spacer 311h, the semiconductor layer 312h and the filling layer 380h.

In a modified example embodiment, the channel hole H that may be defined by the semiconductor spacer 311 may be fully filled up with the amorphous silicon layer, so a crystalline silicon rod filling up the channel hole H may be provided as the semiconductor layer 312h. In such a case, a top portion of the channel hole H may be encapsulated by the crystalline silicon.

Figure 15B:
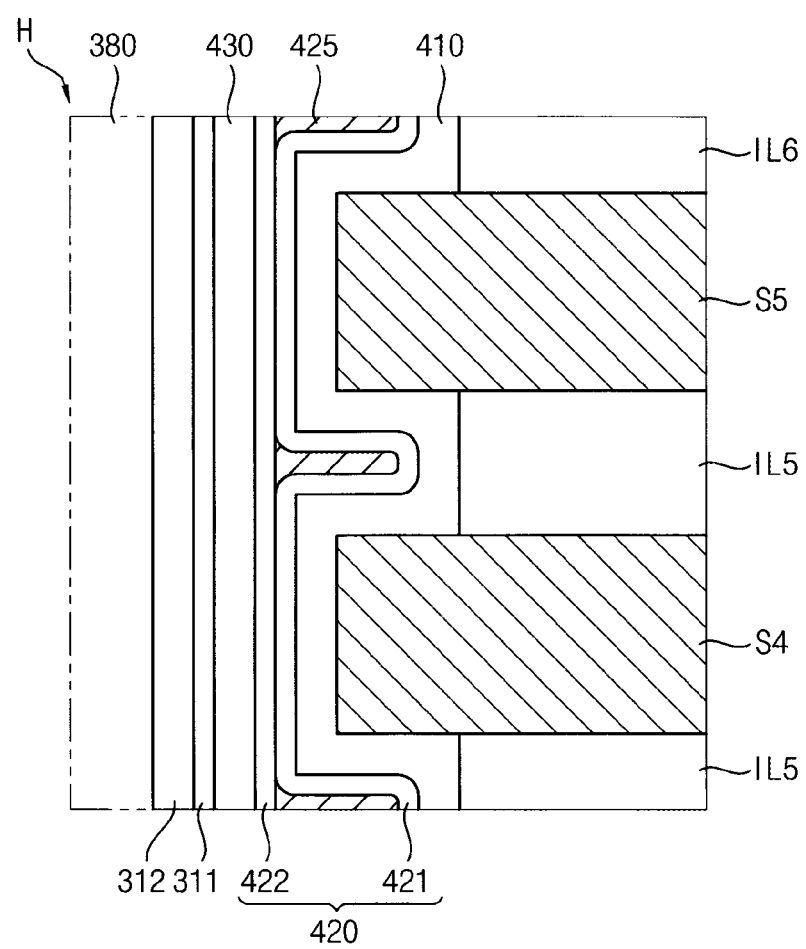

Referring to FIGS. 15A and 15B, an active column 300 may be formed in the channel hole H.

For example, the filling layer 380h, the semiconductor layer 312h, the tunnel insulation layer 430h, the charge trap layer 420h and the block layer 410h may be partially removed from the substrate 100 by a planarization process until a top surface of the first mask pattern M1 may be exposed. Thus, the tunnel insulation layer 430h, the charge trap layer 420h and the block layer 410h may only remain in the channel hole H and may be formed into the charge trap structure 400 including the block pattern 410, the charge trap pattern 420 having the first pattern 421, the second pattern 422 and the anti-coupling structure 425 and the tunnel insulation pattern 430. In addition, the semiconductor layer 312h separated from the charge trap structure 400 by the semiconductor spacer 311 and the filling layer 380h may also remain only in the channel hole H and be formed into the channel structure or the active column including the semiconductor spacer 311, the cylindrical semiconductor pattern 312 and the filler 380.

Upper portions of the charge trap structure 400 and the active column 300 may be recessed downwards and the insulative contact pad 390 may be formed at the upper portions of the charge trap structure 400 and the active column 300. The contact pad 390 may be arranged at each upper portion of the channel hole H and may be separated by an upper insulation pattern UL.

Figure 16A:
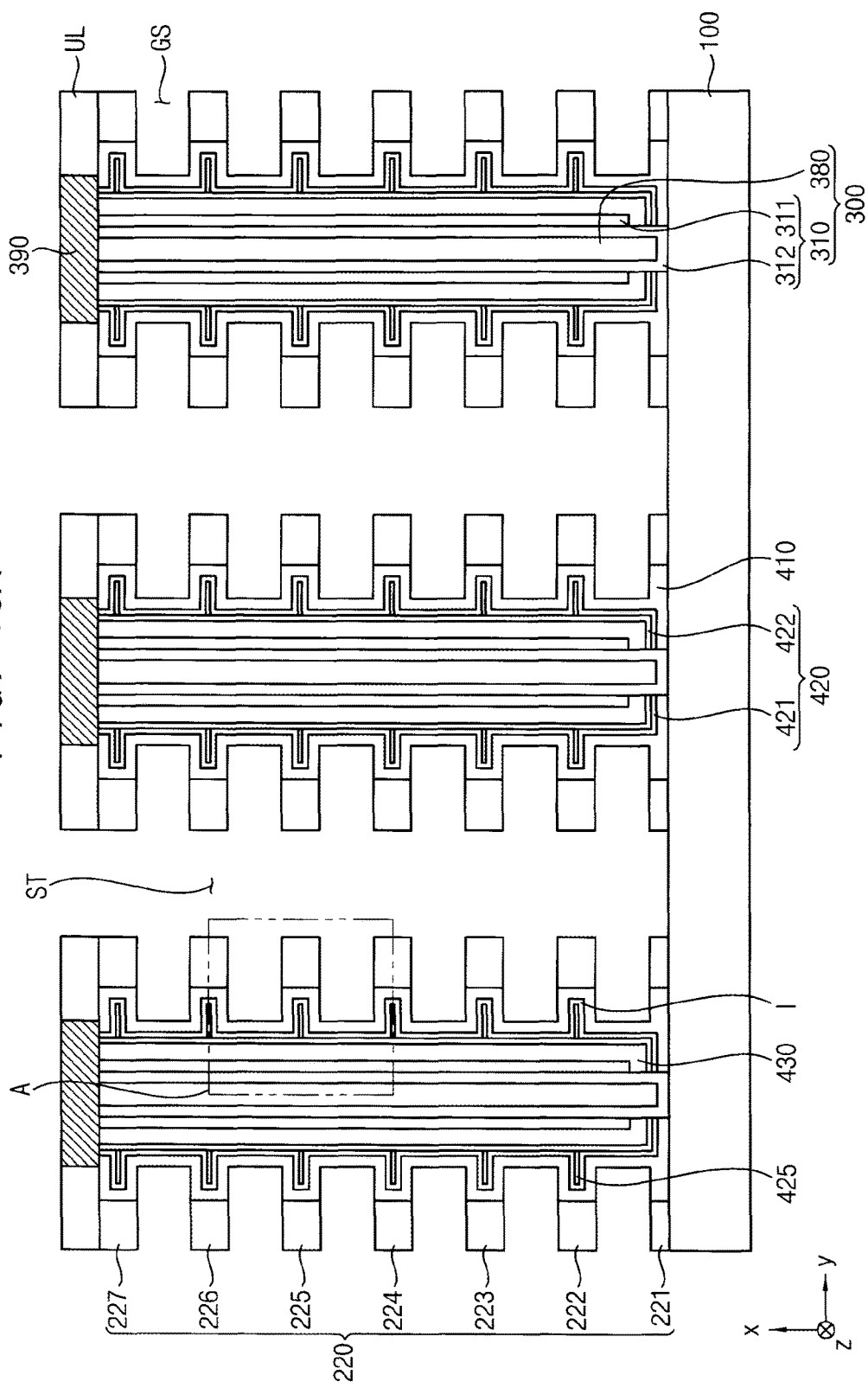
Figure 16B:
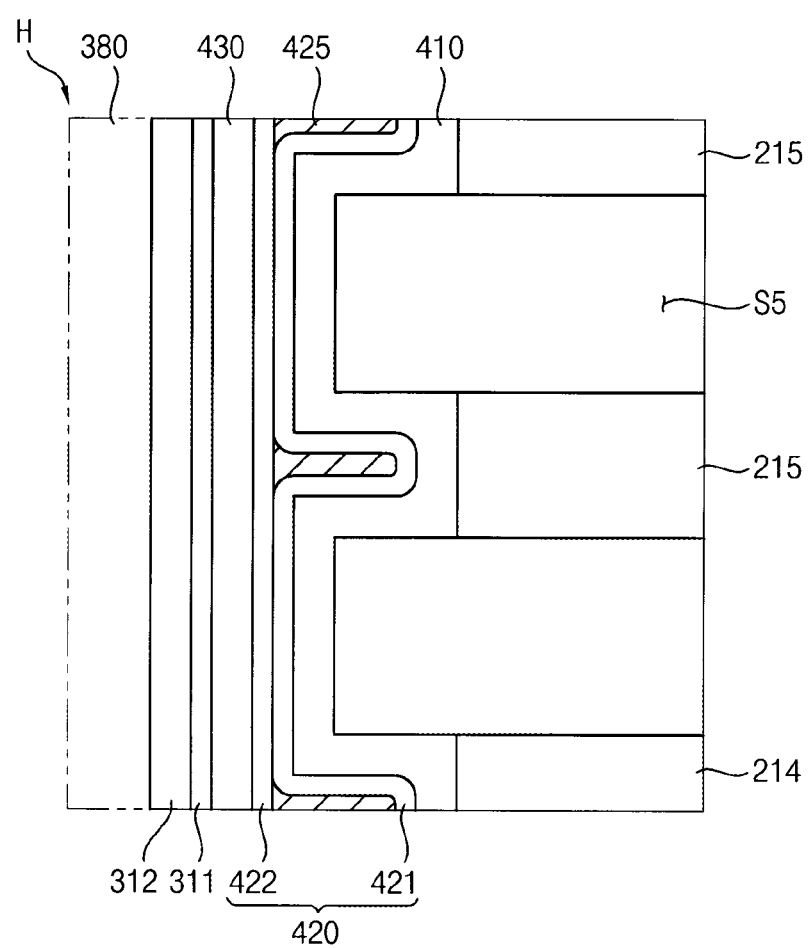

Referring to FIGS. 16A and 16B, the upper insulation pattern UL, the insulation interlayer IL and the sacrificial layer S may be sequentially etched off from the substrate 100, thereby forming a separation trench ST that may extend in the third direction z and may partially expose the substrate 100. Thus, the insulation interlayer IL may be formed into an insulation interlayer structure 220 and a sacrificial pattern (not shown) on the substrate 100.

Then, the sacrificial pattern that may be exposed to the separation trench ST may be removed from the insulation interlayer structure 220, thereby forming a gate space GS between the vertically neighboring insulation interlayer patterns. Thus, the gate space OS may be defined by the vertically neighboring insulation interlayer patterns and the block pattern 410.

In some example embodiments, the sacrificial pattern may comprise silicon nitride or silicon oxynitride and may be removed by a wet etching process using phosphoric acid aqueous solution.

Figure 17B:
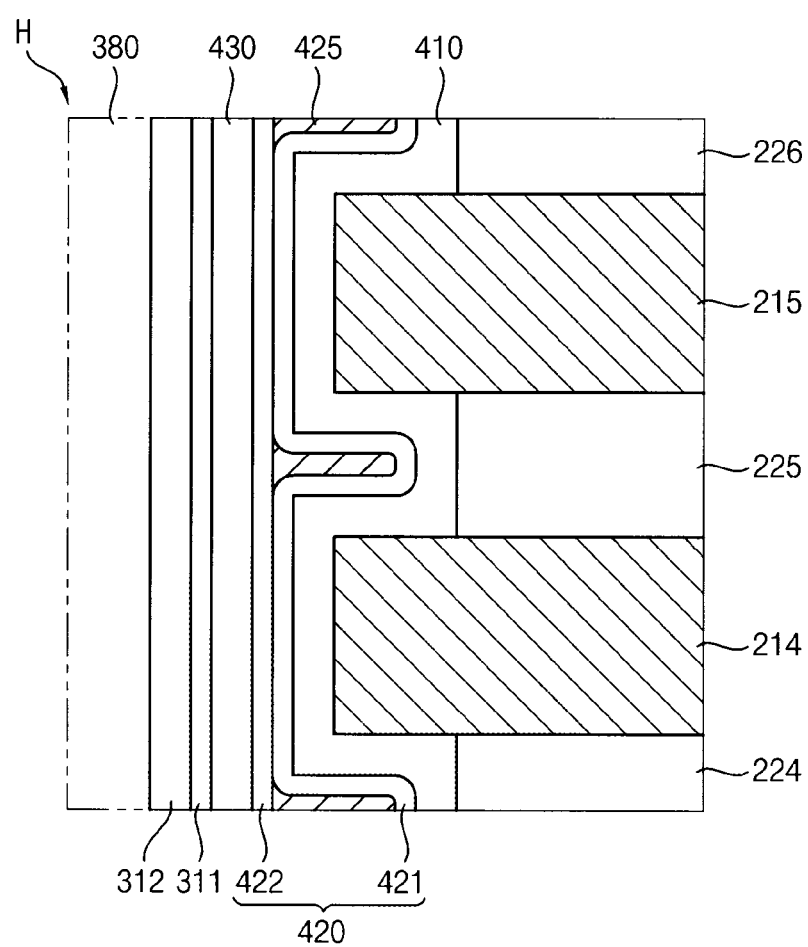
Figure 18:
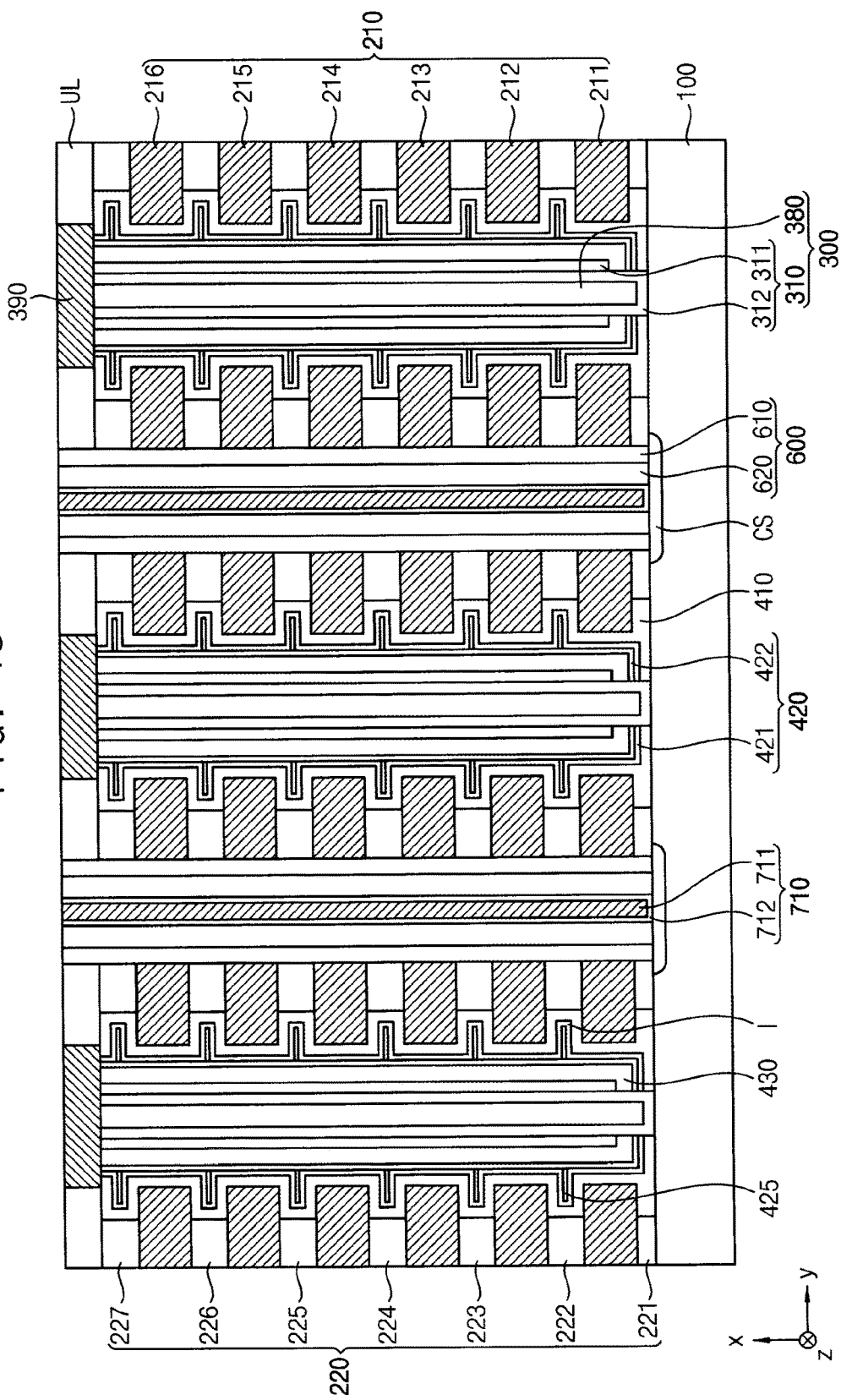
FIG. 18 is a cross-sectional view illustrating a processing step for a method of manufacturing the vertical memory device shown in FIGS. 1 to 4.
Figure 19:
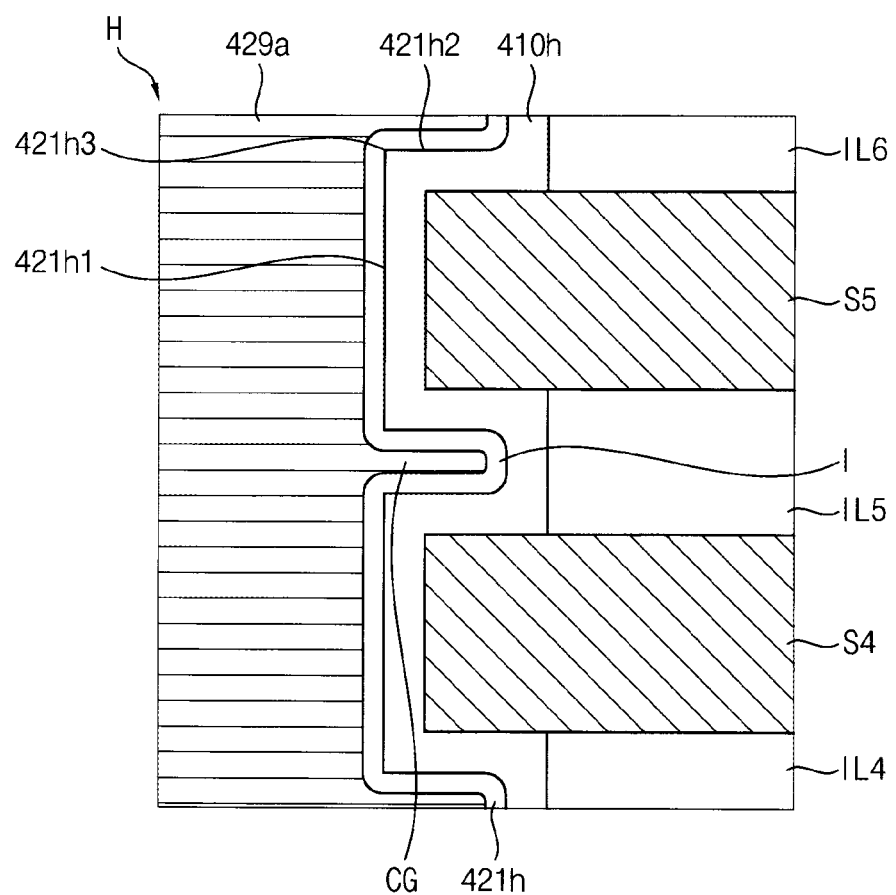
FIGS. 19 to 23 are cross sectional views illustrating processing steps for a method of forming the first modification of the charge trap structure shown in FIG. 5.

Referring to FIGS. 17A and 17B, a conductive layer (not shown) may be formed on the contact pad 390 and the upper insulation pattern UL in such a way that the separation trench ST may be sufficiently filled with the conductive layer. Then, the conductive layer may be removed from the separation trench ST such that the conductive layer may remain only in the gate space GS, thereby forming the conductive structures 210 interposed between the vertically neighboring insulation interlayer patterns of the insulation interlayer structure 220. The conductive layer may be formed by an ALD process or a CVD process.

The conductive layer may comprise silicon (Si), a low-resistive metal such as tungsten (W), titanium (Ti), tantalum (Ta) and platinum (Pt) and a metal nitride or a metal silicide of the low-resistive metal.

Although not shown in figures, a barrier layer (not shown) may be further formed in the separation trench ST prior to the formation of the conductive structure 210. The conductive structure 210 may be provided as the gate electrode for the vertical memory device 1000.

Thereafter, impurities or dopants having an electrical polarity may be implanted onto the substrate 100 that may be exposed through the separation trench ST, thereby forming a common source CS at the bottom of the separation trench ST.

Referring to FIG. 18, a trench spacer 610 and a device isolation pattern 620 may be formed on both sidewalls of the separation trench ST, thereby forming a trench filling pattern 600, and the reduced separation trench ST defined by the trench filling pattern 600 may be filled up with the source interconnector 710 that may be contact with the common source CS. For some example embodiments, the source interconnector 710 may include a source plug 710 and a source barrier 712 enclosing the source plug 711. A plurality of the source interconnectors 710 may be arranged in the third direction z by the same gap distance.

Then, a source line 720 may be formed into a line pattern that may extend in the third direction z and may be contact with the source interconnectors 710 along the third direction z and a source contact 721 may be formed on the source line 710. A common source line CSL may be formed into a line extending in the second direction y and may contact with a plurality of the source contacts 721, thus a plurality of the source lines 720 may be connected to a single common source line CSL. Therefore, a source line structure 700 may be formed on the gate stack structure 200 and data signals may be applied to the common source CS via the source line structure 700.

Thereafter, a bit line structure 500 and a wiring structure may be formed on the source line structure 700. The wiring structure may be electrically connected with the bit line structure 500 and the source line structure 700.

The modifications of the charge trap structures shown in FIGS. 5 to 7 may be formed as following processes with references to FIGS. 19 to 34. The manufacturing processes for forming the modifications of the charge trap structures will be described with references to enlarged views corresponding to the portion A of FIG. 8A.

FIGS. 19 to 23 are cross sectional views illustrating processing steps for a method of forming the first modification of the charge trap structure shown in FIG. 5.

Referring to FIGS. 1 to 3, 5 and 19, the channel hole H, which may be defined by the first trap layer 421h, may be filled with polysilicon, as described in detail with reference to FIGS. 8A to 11B.

For example, a first polysilicon bulk 429a may be formed in the channel hole H defined by the first trap layer 421h by an ALD process or a CVD process in such a way that the cell gap CG may be sufficiently filled with polysilicon.

Figure 20:
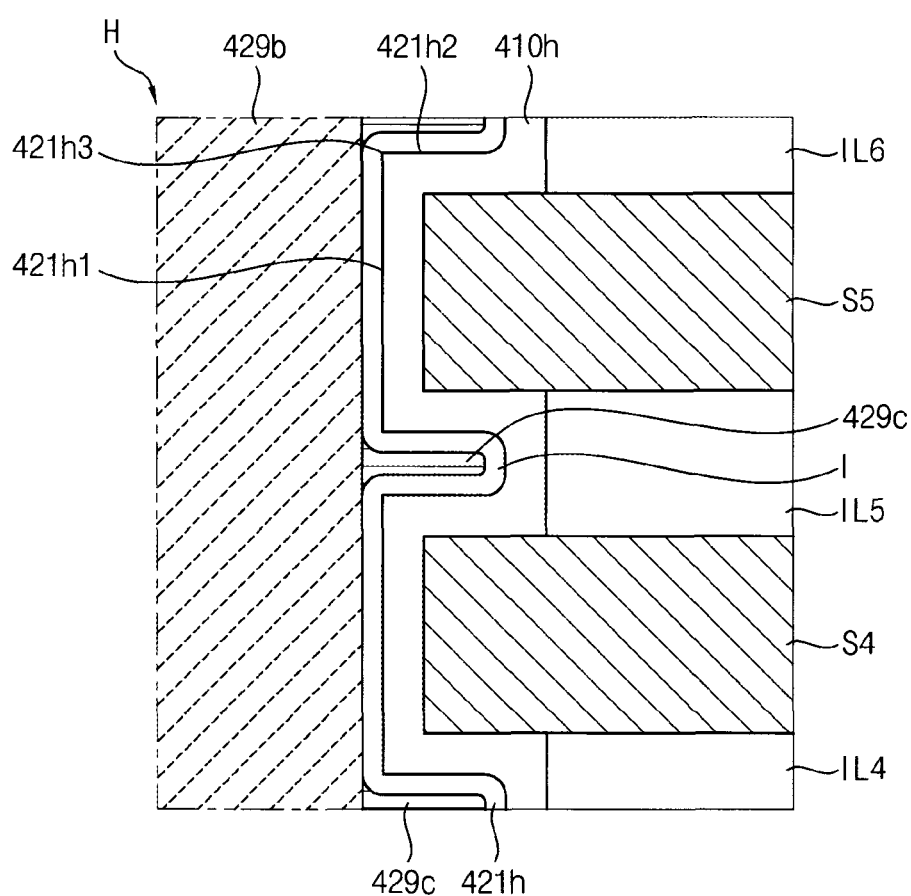

Referring to FIG. 20, an oxidation process may be performed to the first polysilicon bulk 429a and the first polysilicon bulk 429a may be formed into a first silicon oxide column 429b extending in the first direction x in the channel hole H in such a way that the polysilicon may remain in the cell gap CG as first polysilicon residuals 429c.

For example, a wet oxidation process may be performed to the first polysilicon bulk 429a under a relatively low temperature using the first trap layer 421h as an oxidation stop layer, so most of the polysilicon in the channel hole H may be transformed into silicon oxide along the channel hole H, thereby forming the first silicon oxide column 429b. Particularly, the thickness of the first silicon oxide column 429b may be accurately controlled in such a way that the surface of the first silicon oxide column 429b may be coplanar with the surface of the vertical portion 421h1 of the first trap layer 421. The oxidation process may be stopped when the polysilicon around the vertical portion 421h1 of the first trap layer 421h may be sufficiently oxidized, so that the polysilicon in the cell gap CG may still remain non-oxidized.

Accordingly, the first polysilicon bulk 429a may be formed into the first silicon oxide column 429b making contact with the vertical portion 421h1 in the channel hole H and the first polysilicon residuals 429c defined by the first silicon oxide column 429b and the horizontal portion 421h2 and the connection portion 421h3 of the first trap layer 421h.

Figure 21:
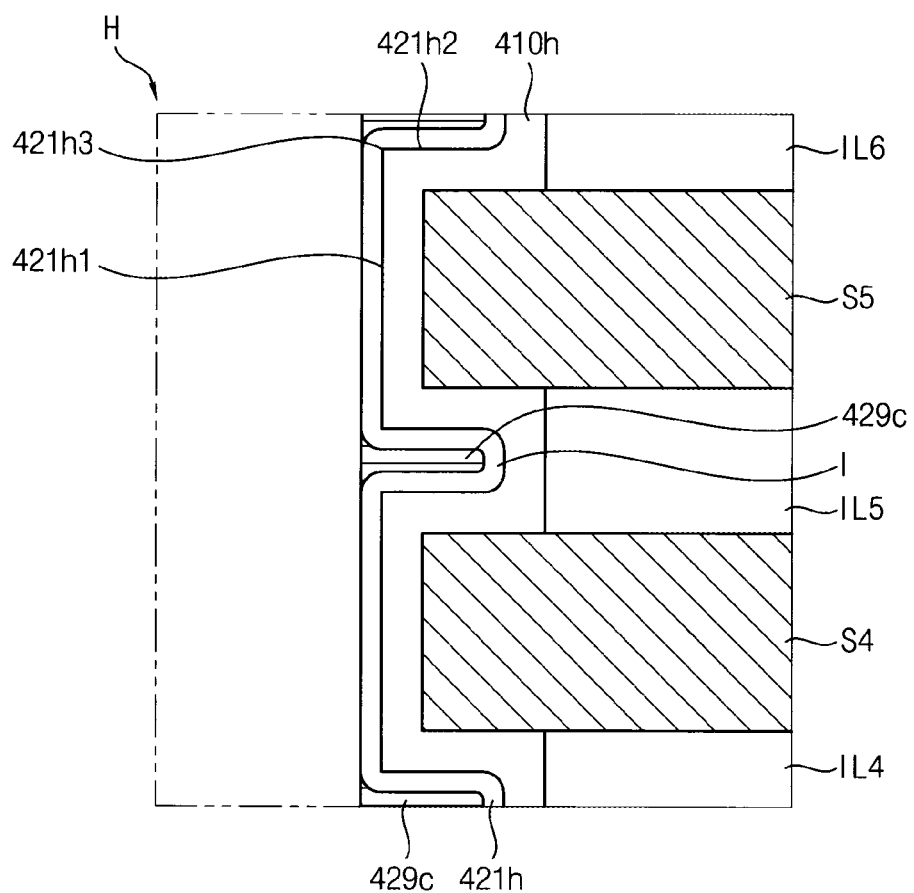

Referring to FIG. 21, the first silicon oxide column 429b may be removed from the channel hole H and the first polysilicon residuals 429c may be exposed to the channel hole H. For example, the first silicon oxide column 429b may be removed by a wet etching process.

Figure 22:
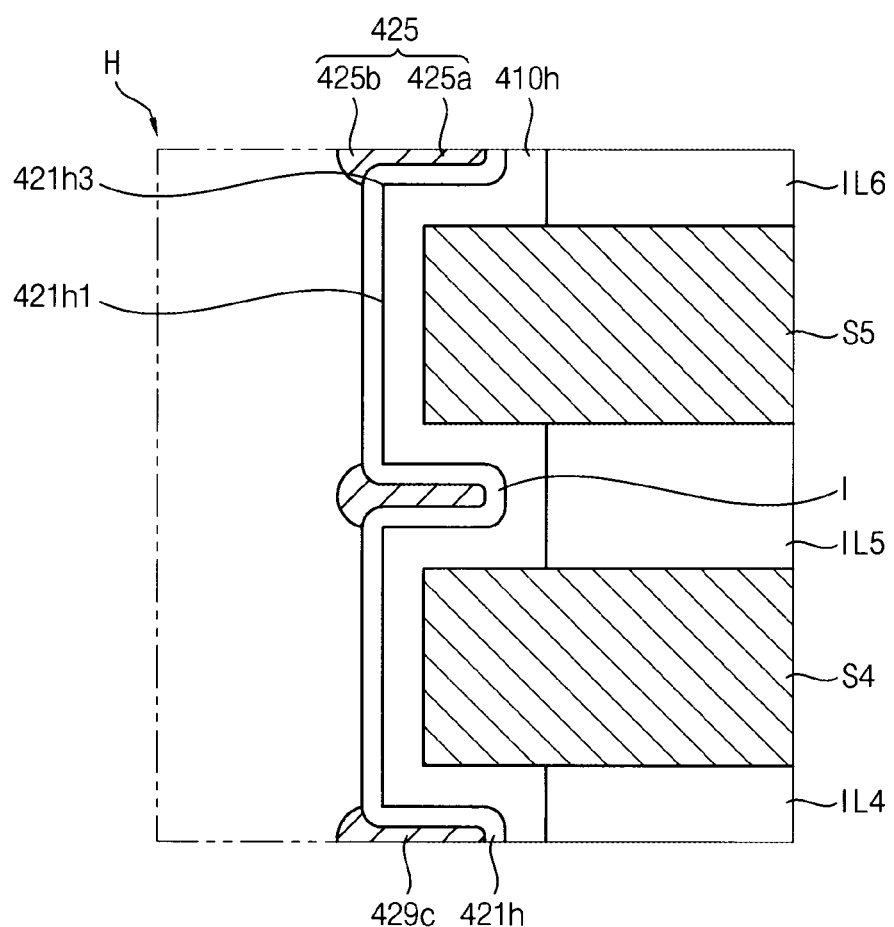

Referring to FIG. 22, a thermal treatment may be performed to the polysilicon residuals 429c in the cell gap CG, thereby forming the anti-coupling structure 425 having the indent portion 425a and the protrusion portion 425b. The indent portion 425a may be formed in the cell gap CG and the protrusion portion 425b may be swelled toward the channel hole H from the cell gap CG to be protruded from the surface of the vertical portion 421h1 of the first trap layer 421h.

The volume of the polysilicon residuals 429c may expand more than about 2 times the original volume in the oxidation process. However, since the cell gap CG may be closed by the first trap layer 421h and may be open toward the channel hole H, the expanded polysilicon residuals 429c may be excessively swelled out or be grown toward the central portion of the channel hole H, thereby forming the protrusion portion 429c of the anti-coupling structure 425.

Therefore, the polysilicon residuals 429c may be formed into the anti-coupling structure 425 having the indent portion 425a and the protrusion portion 425b by the thermal oxidation process. Since the dielectric constant of the anti-coupling structure 425 may be sufficiently smaller than that of the second trap layer 422h, which may be formed in a subsequent process, so the coupling between the gate electrodes of the conductive structure 210 that may be provided in place of the sacrificial layer S in a subsequent process may be sufficiently prevented, reduced, or minimized.

Figure 23:
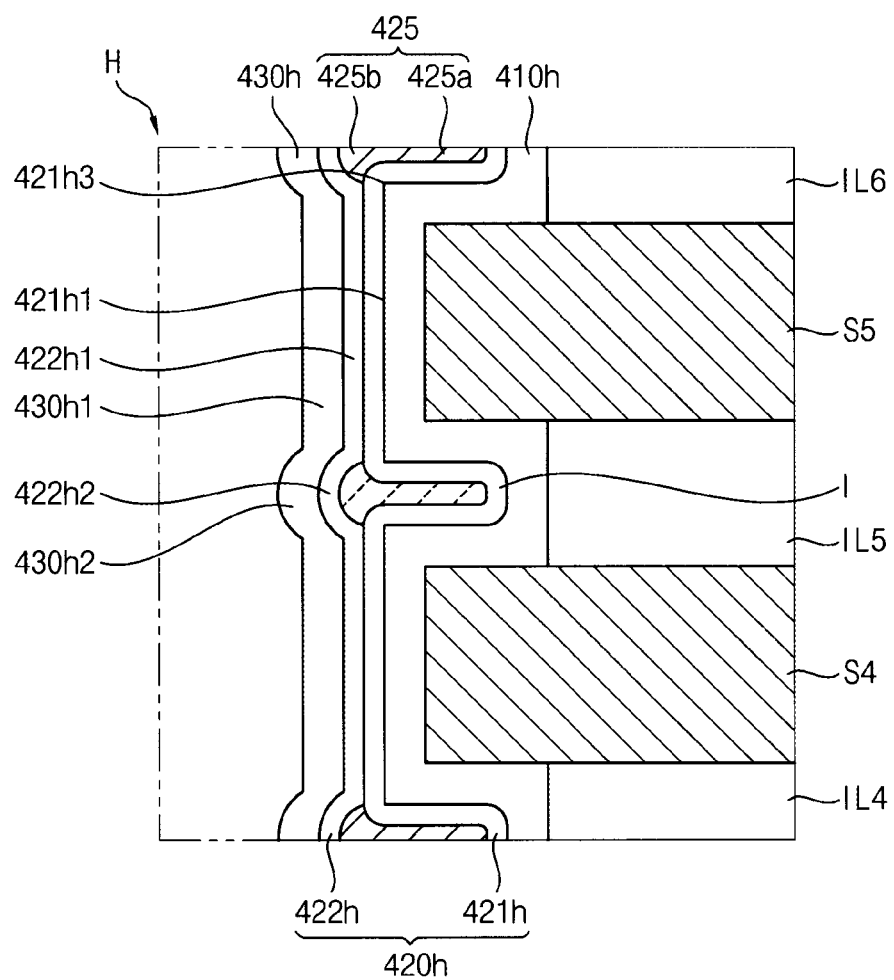
Figure 24:
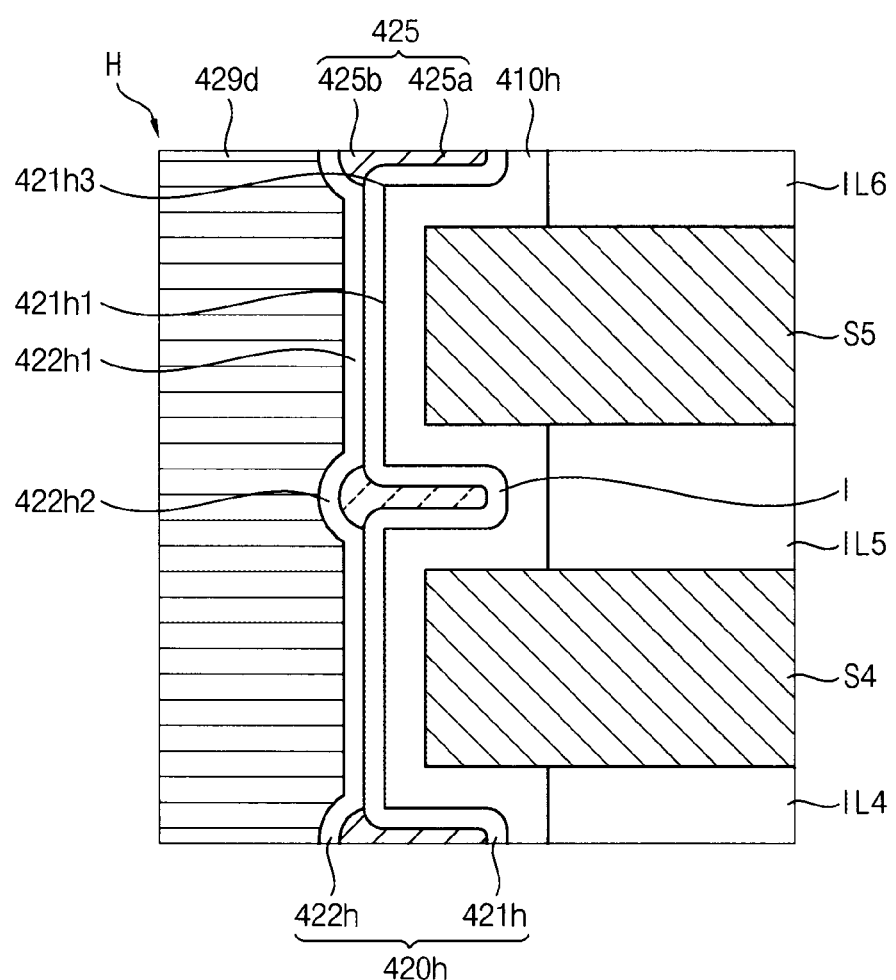
FIGS. 24 to 28 are cross sectional views illustrating processing steps for a method of forming the second modification of the charge trap structure shown in FIG. 6.

Referring to FIG. 23, a second trap layer 422h may be formed on the vertical portion 421h1 of first trap layer 421h and the protrusion portion 425a in the first direction x and a tunnel insulation layer 430h may be formed on the second trap layer 422h in the first direction x. The second trap layer 422h and the tunnel insulation layer 430h may be formed in the same way as described in detail with reference to FIG. 13B.

Particularly, the second trap layer 422h may be formed into a linear pattern 422h1 in parallel with the vertical portion 421h1 of the first trap layer 421h around the sacrificial pattern S and may be formed into a convex portion 422h2 that may be swelled along a surface profile of the protrusion portion 425b of the anti-coupling structure 425 around each insulation interlayer pattern IL. The tunnel insulation layer 430h may be formed on the second trap layer 422h along a surface profile of the second trap layer 422h, so the tunnel insulation layer 430h may also have a linear portion 430h1 making contact with the linear portion 422h1 of the second trap layer 422h and a curvilinear portion 430h2 making contact with the convex portion 422h2 of the second trap layer 422h.

Then, the active column 300 may be formed in the channel hole H by the same process as described in detail with reference to FIG. 14B, thereby forming the first modification of the charge trap structure 400 as shown in FIG. 5. In some example embodiments, the active column 300 may also be formed into a linear pattern contact with the linear portion 430h1 of the tunnel insulation layer 430h around the sacrificial pattern S and may be formed into a curvilinear pattern contact with the curvilinear portion 430h2 of the tunnel insulation layer 430h around each insulation interlayer pattern IL.

Thereafter, the processing steps as described in detail with reference to FIGS. 15A to 18 may be further conducted, thereby forming the vertical memory device 1000 including the charge trap structure shown in FIG. 5.

Accordingly, the electron path via the second pattern 422 may be elongated and the size of the anti-coupling structure 425 may increase in the vertical memory device 1000, thus the electron diffusion between the neighboring stack cells may be reduced and/or minimized and the coupling between the neighboring stack cells may be sufficiently reduced and/or prevented in the vertical memory device 1000.

FIGS. 24 to 28 are cross sectional views illustrating processing steps for a method of forming the second modification of the charge trap structure shown in FIG. 6.

Referring to FIGS. 1 to 3, 6 and 24, after the second trap layer 422h may be formed in the channel hole H in such a way that the linear portion 422h1 and the convex portion 422h2 may be arranged around the sacrificial pattern S and the insulation interlayer pattern IL, respectively, as described in detail with reference to FIGS. 8A to 11B and 19 to 23, the channel hole H, which may be defined by the second trap layer 422h, may also be filled with polysilicon.

For example, a second polysilicon bulk 429d may be formed in the channel hole H defined by the second trap layer 422h by an ALD process or a CVD process in such a way that the cell gap CG may be sufficiently filled with polysilicon.

Figure 25:
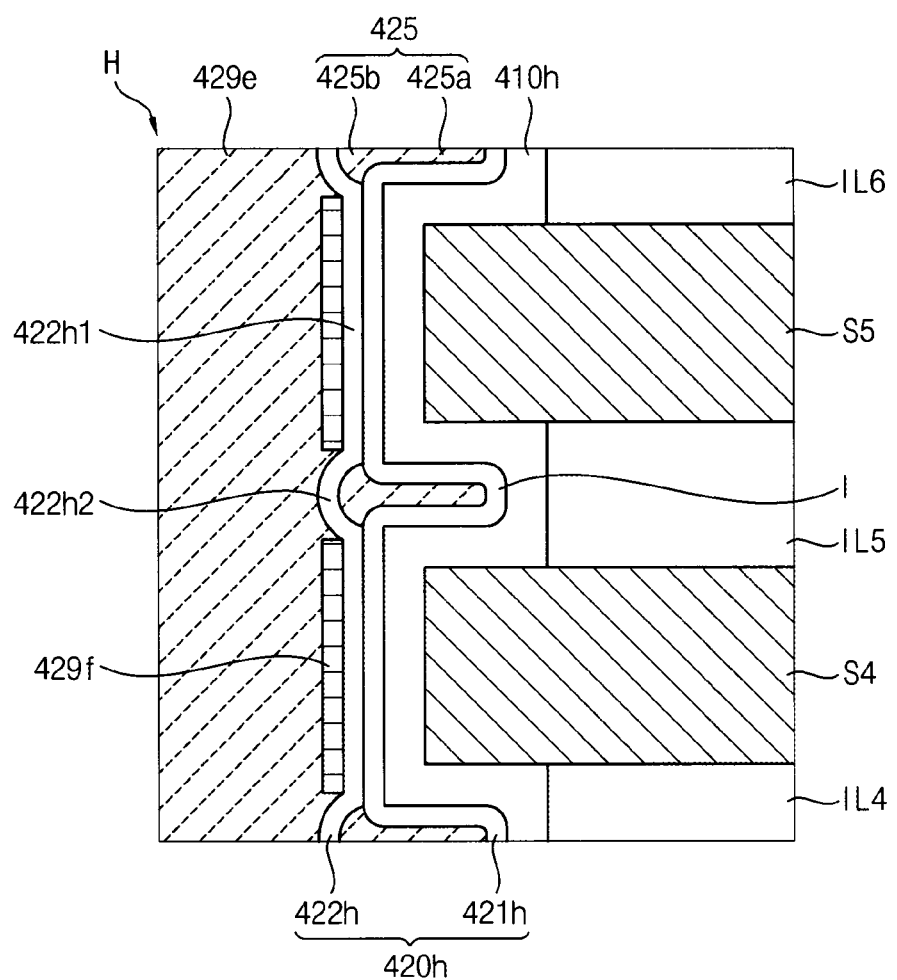

Referring to FIG. 25, an oxidation process may be performed to the second polysilicon bulk 429d and the second polysilicon bulk 429d may be formed into a second silicon oxide column 429e extending in the first direction x in the channel hole H in such a way that the polysilicon may remain between the linear portion 422h1 of the second trap layer 422h and the second silicon oxide column 429e.

For example, a wet oxidation process may be performed to the second polysilicon bulk 429d under a relatively low temperature using the second trap layer 422h as an oxidation stop layer, so most of the polysilicon in the channel hole H may be transformed into silicon oxide along the channel hole H, thereby forming the second silicon oxide column 429e. Particularly, the thermal oxidation process for forming the second silicon oxide column 429e may be accurately controlled to stop at a time when the second silicon oxide column 429e may be contact with the convex portion 422h2 of the second trap layer 422h, so that the polysilicon may remain in an area between the second silicon oxide column 429e and the linear portion 422h1 of the second trap layer 422h.

Accordingly, the second polysilicon bulk 429d may be formed into the second silicon oxide column 429e making contact with the convex portion 422h2 in the channel hole H and the second polysilicon residuals 429f defined by the second silicon oxide column 429e and the linear portion 422h1 of the second trap layer 422h.

Figure 26:
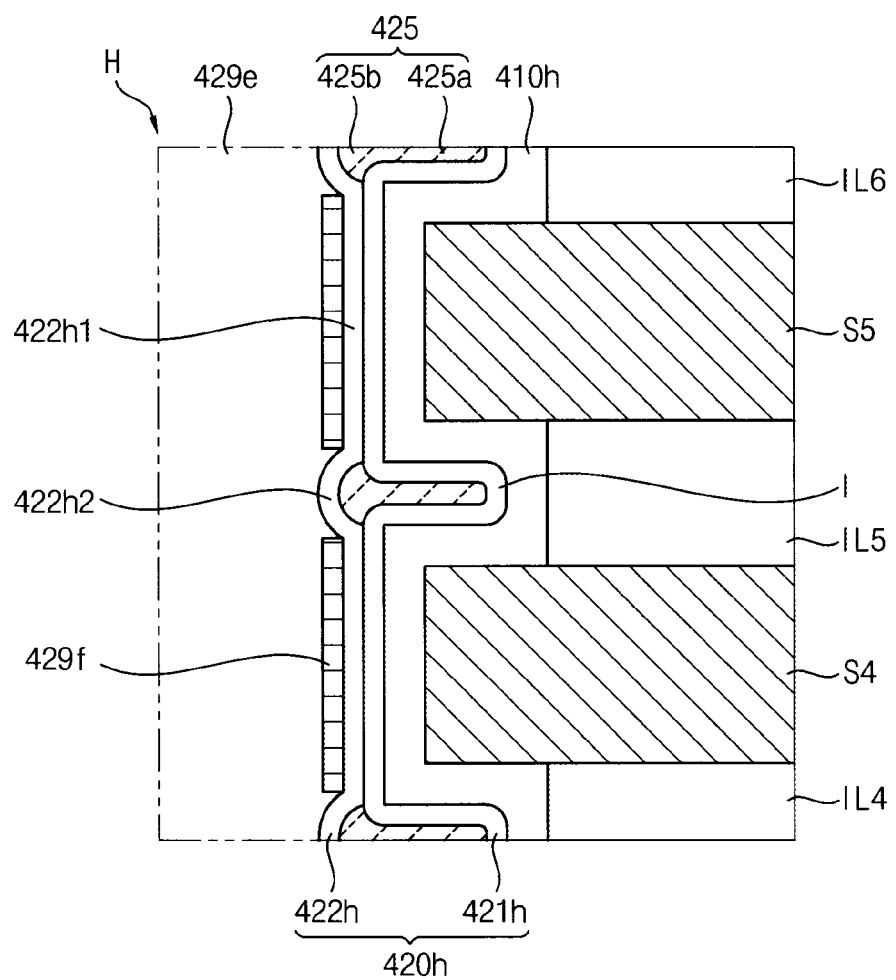

Referring to FIG. 26, the second silicon oxide column 429e may be removed from the channel hole H and the second polysilicon residuals 429f may be exposed to the channel hole H. For example, the second silicon oxide column 429e may be removed by a wet etching process similar to the first silicon oxide column 429b.

Figure 27:
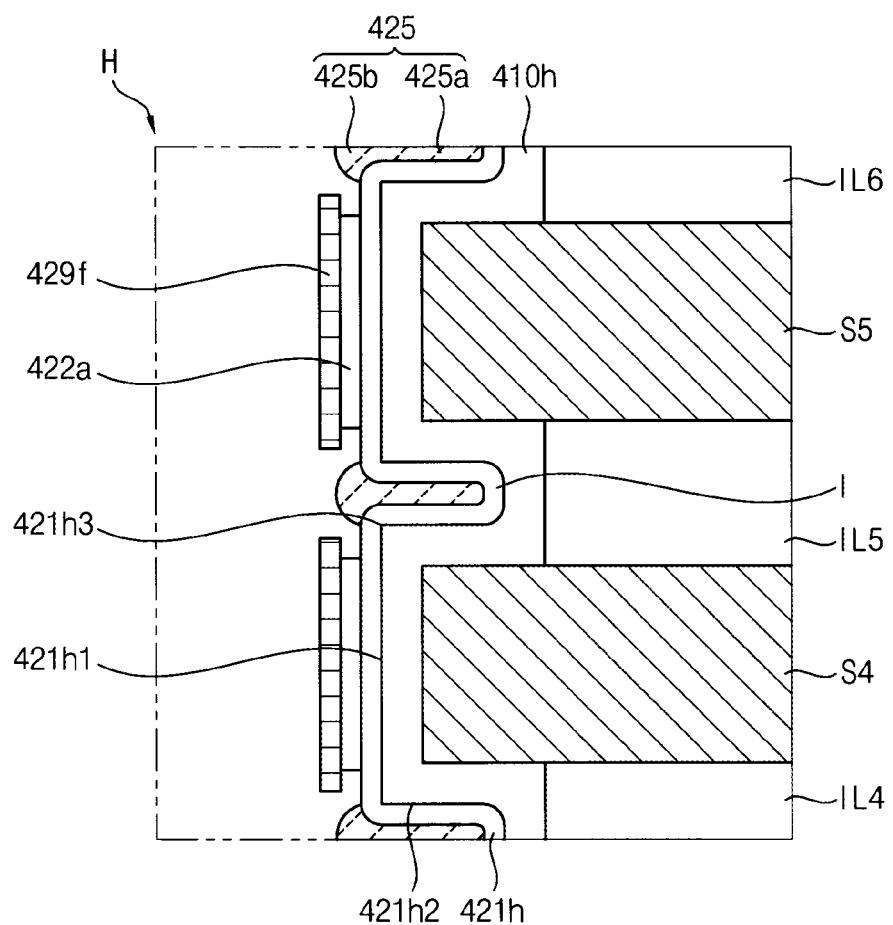

Referring to FIG. 27, the convex portion 422h1 of the second trap layer 422h may be removed from the channel hole H by an etching process using the second polysilicon residuals 429f as an etching mask, until only the linear portion 422h1 of the second trap layer 422h may remain in the channel hole H.

Thus, the second trap layer 422h may be formed into a linear pattern making contact with the vertical portion 421h1 of the first trap layer 421h and the protrusion portion 425b of the anti-coupling structure 425 may be exposed again to the channel hole H. That is, the second trap layer 422h may be formed into a second separated linear pattern 422a that may be just arranged around the sacrificial pattern S while the anti-coupling structure 425 may be exposed to the channel hole H around the insulation interlayer pattern IL.

Further, the charge trap layer 420h having the first trap layer 421h and the second trap layer 422h may be formed into the combined structure of the vertical portion 421h1 and the linear portion 422h1 around the sacrificial pattern S and the anti-coupling structure 425 that may be exposed to the channel hole H and covered by the horizontal portion 421h2 and the connection portion 421h3 around the insulation interlayer pattern IL. Thus, the charge trap layer 420h may have a greater trap density around the sacrificial pattern S rather than around the insulation interlayer pattern IL.

Figure 28:
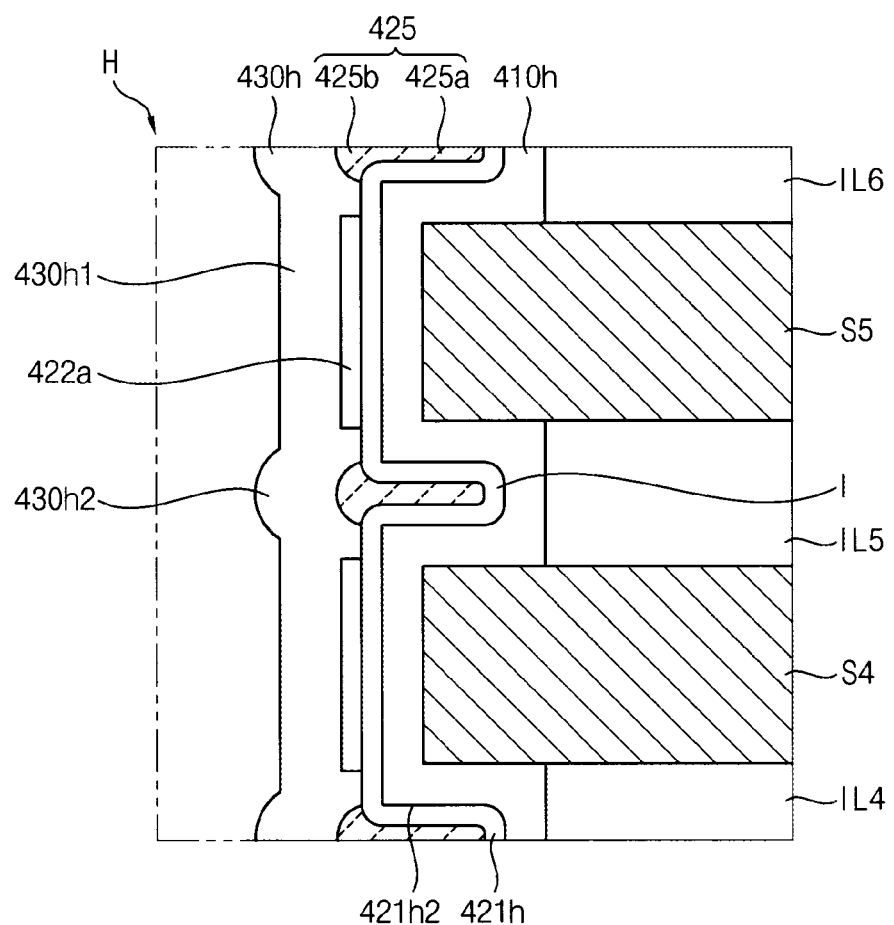
Figure 29:
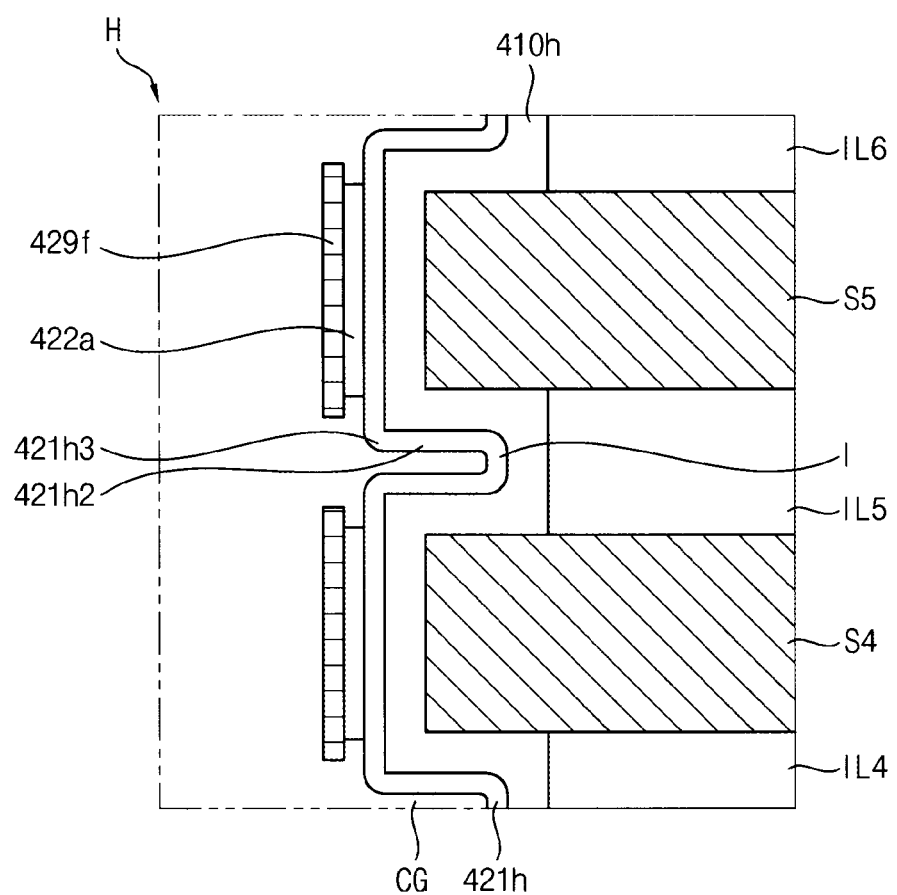
FIGS. 29 to 34 are cross sectional views illustrating processing steps for a method of forming the second modification of the charge trap structure shown in FIG. 7.

Referring to FIG. 28, the second polysilicon residuals 429f may be removed from the channel hole H and a tunnel insulation layer 430h may be formed on the second separated linear pattern 422a, the vertical portion 421h1 of the first trap layer 421h and the protrusion portion 425b of the anti-coupling structure 425.

Thus, the tunnel insulation layer 430h may be formed on the separated layer pattern 422a and the vertical portion 421h1 of the first trap layer 421h, so the tunnel insulation layer 430h may also have a linear portion 430h1 making contact with the second separated linear pattern 422a and a curvilinear portion 430h2 making contact with the convex portion 422h2 of the second trap layer 422h.

The tunnel insulation layer 430h may be formed by the same process as described in detail with reference to FIG. 13B.

Then, the active column 300 may be formed in the channel hole H by the same process as described in detail with reference to FIG. 14B, thereby forming the second modification of the charge trap structure 400 as shown in FIG. 6. In some example embodiments, the active column 300 may also be formed into a linear pattern contact with the linear portion 430h1 of the tunnel insulation layer 430h around the sacrificial pattern S and may be formed into a curvilinear pattern contact with the curvilinear portion 430h2 of the tunnel insulation layer 430h around each insulation interlayer pattern IL.

Thereafter, the processing steps as described in detail with reference to FIGS. 15A to 18 may be further conducted, thereby forming the vertical memory device 1000 including the charge trap structure shown in FIG. 6.

Accordingly, since the second trap layer 422h may be formed into the second separated linear pattern 422a along the first direction x, the second pattern 422 of the charge trap pattern 420 in the vertical memory device 1000 may be shortened and as a result, the electron diffusion via the second pattern 422 may be sufficiently reduced and/or prevented between the neighboring stack cells and the charge density in the cell region C1 may be sufficiently improved, which may maintain the memory window size in spite of the downsize of the vertical memory device 1000. In addition, the anti-coupling structure 425 may be expanded in the inter-cell region C2, so the coupling between the neighboring stack cells may also be sufficiently reduced and/or prevented in the vertical memory device 1000.

FIGS. 29 to 34 are cross sectional views illustrating processing steps for a method of forming the second modification of the charge trap structure shown in FIG. 7.

Referring to FIGS. 1 to 3, 7 and 29, after the convex portion 422h2 of the second trap layer 422h may be removed from the channel hole H in the same processes as described in detail with references to FIGS. 8A to 11B and 19 to 27, the anti-coupling structure 425 may also be removed from the cell gap CG.

For example, the anti-coupling structure 425 may be removed by a wet etching process using an etchant having an etching selectivity with respect to the second polysilicon residuals 429f, the second separated linear pattern 422a and the first trap layer 421h. In some example embodiments, the anti-coupling structure 425 may comprise an oxide and the first and the second trap layers 421h and 422h may comprise a nitride, the anti-coupling structure 425 may be etched off by using an etchant having etching selectivity with respect to polysilicon and nitride.

Thus, the cell gap CG defined by the horizontal portion 421h2 and the connection portion 421h3 of the first trap layer 421h may be communicated to the channel hole H. That is, the first trap layer 421h may be partially exposed to the channel hole H.

Figure 30:
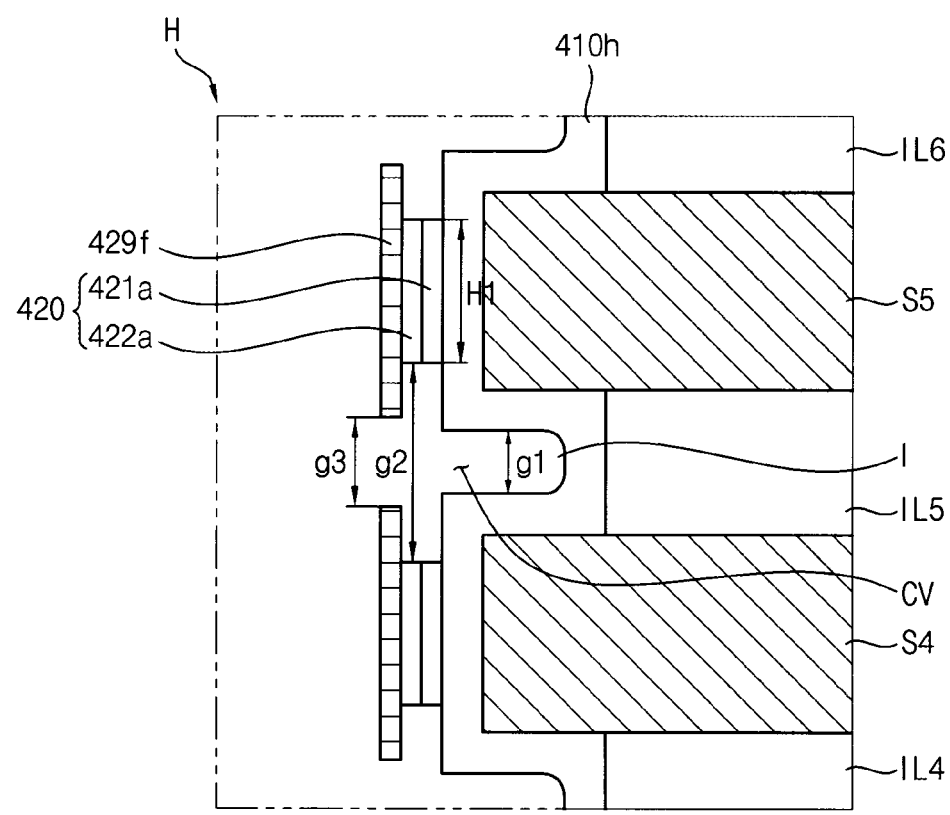

Referring to FIG. 30, the first trap layer 421h may be further removed from the channel hole H, thereby forming a first separated linear pattern 421a that may be combined with the second separated linear pattern 422a. Thus, the charge trap pattern 420 may be formed into a separated and discontinuous pattern in the first direction x in such a way that the first and the second separated linear patterns 421a and 422a may be combined to the single combined pattern around the sacrificial pattern S.

For example, an isotropic etching process may be conducted to the first trap layer 421h with an etching selectivity to the second polysilicon residuals 429f and the block layer 410h. Thus, the horizontal portion 421h2 and the connection portion 421h3 of the first trap layer 421h may be removed from the block layer 410h. In such a case, the vertical portion 421h1 and the second separated liner pattern 422a may also be partially removed together with the horizontal portion 421h2 and the connection portion 421h3 due to isotropic characteristics of the etching process.

Accordingly, a cavity CV may be formed around the insulation interlayer pattern IL and the cavity CV may be defined by the block layer 410h, the charge trap pattern 420 and the second polysilicon residuals 429f.

The charge trap pattern 420 may be provided as the single combined pattern of the first separated linear pattern 421a and the second separated linear pattern 422a and may be arranged on the block layer 410h around the sacrificial pattern S. Particularly, an upper portion of the charge trap pattern 420 may be lower than an upper portion of the corresponding sacrificial pattern and a lower portion of the charge trap pattern 420 may be higher than a lower portion of the corresponding sacrificial pattern, so that the height H1 of the charge trap pattern 420 may be smaller than the height H2 of the corresponding sacrificial pattern.

In some example embodiments, the cavity CV may be characterized by a first gap g1 corresponding to a recess size of the inter-cell recess R that may be defined by the block layer 410h, a second gap g2 corresponding to a gap distance between the vertically neighboring charge trap patterns 420 and a third gap 3 corresponding to a gap distance between the vertically neighboring second polysilicon residuals 429f. In such a case, the second gap g2 may be much greater than the first and the second gaps g1 and g2 due to the isotropic etching process.

Figure 31:
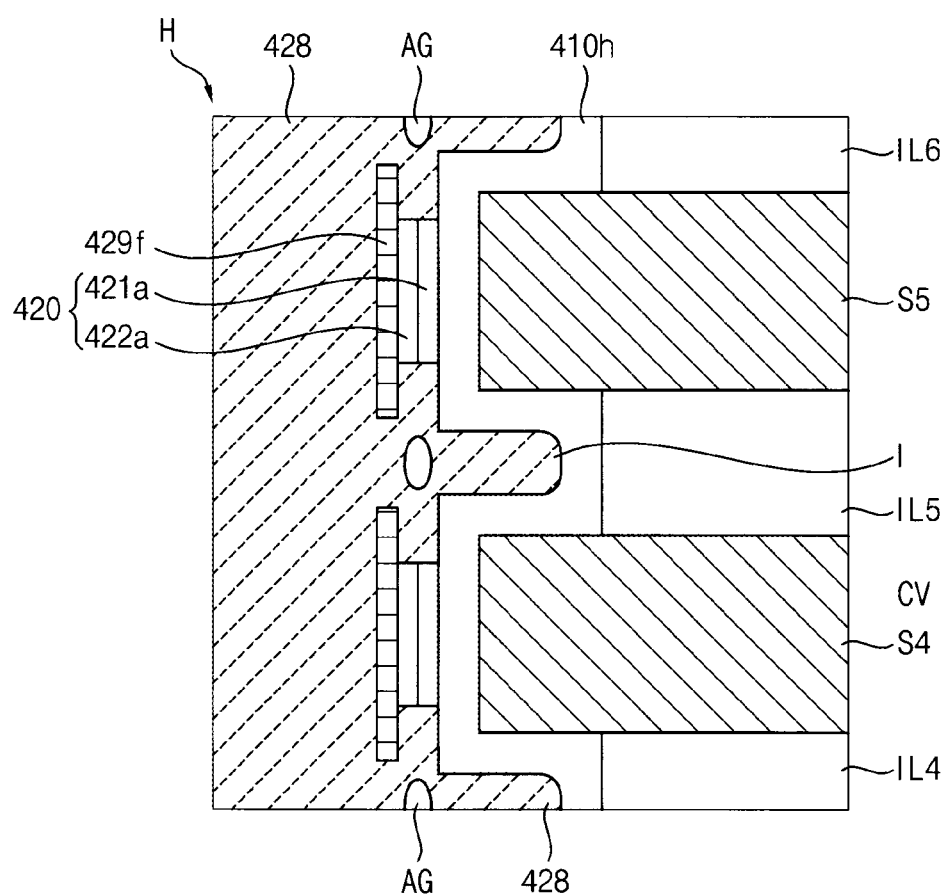

Referring to FIG. 31, the channel hole H may be filled with an oxide by an ALD process or a CVD process, thereby forming a gap fill oxide layer 428 in the channel hole H. Particularly, the oxide for the gap fill oxide layer 428 may have good gap fill characteristics and a dielectric constant smaller than the charge trap pattern 420, so the cavity CV may be filled with an insulation materials of which the dielectric constant may be smaller than that of the charge trap pattern 420.

The oxide may flow into the cavity CV from the channel hole H via the third gap g3 until the inter-cell recess R may be filled with the oxide. In such a case, since the second gap g2 may be much greater than the first and third gaps g1 and g3, a void may be generated at a central portion of the cavity CV under the charge trap pattern 420. Since the void may be filled with air, the gap fill oxide layer 428 may have an air gap AG at the central portion of the cavity CV.

Particularly, the void may be self-aligned with the charge trap pattern 420 in the first direction x in the deposition process, so the air gap AG may be aligned with the charge trap pattern 420 any may be arranged at every inter-cell region C2 in the first direction x.

Figure 32:
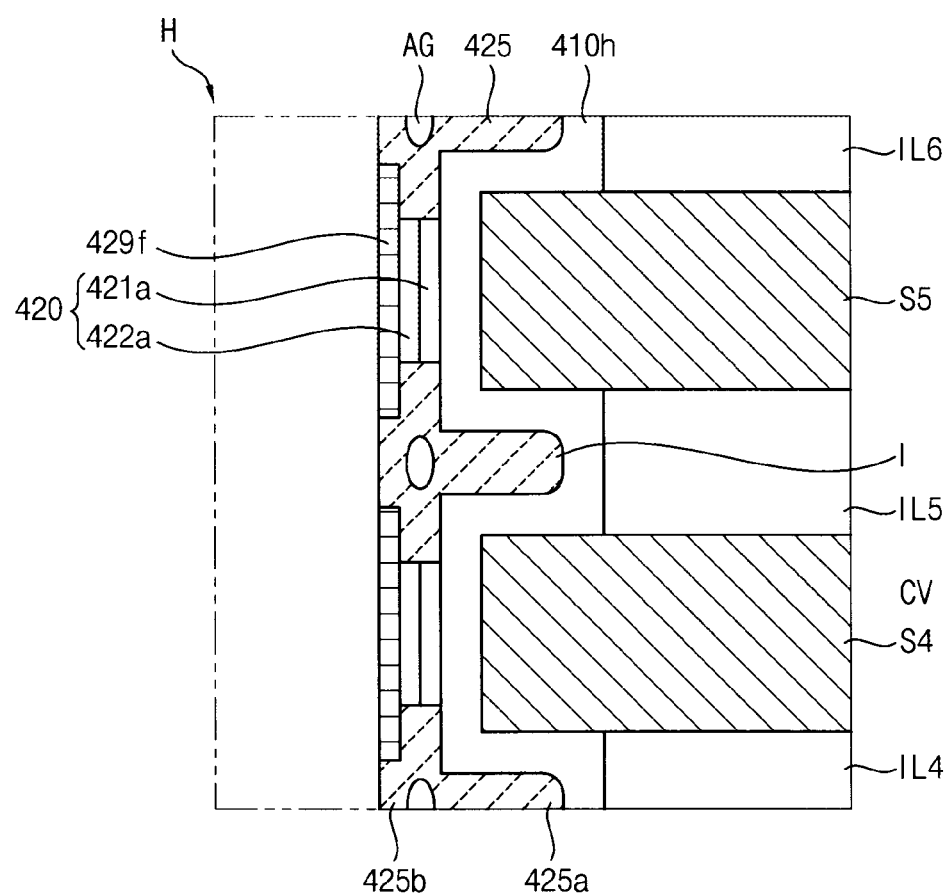

Referring to FIG. 32, the gap fill oxide layer 428 may be partially removed from the channel hole H by an etching process using the second polysilicon residuals 429f as an etching mask in such a way that the gap fill oxide layer 428 may remain only in the cavity CV, thereby forming the anti-coupling structure 425 in the cavity CV.

For example, an etch-back process may be performed to the gap fill oxide layer 428 using the second polysilicon residuals 429f as an etching mask, so the gap fill oxide layer 428 may be removed until the second polysilicon residuals 429f may be exposed. Thus, the gap fill oxide layer 428 may remain only in the cavity CV after etch-back process.

Therefore, the anti-coupling structure 425 having the air gap AG may be arranged under the charge trap pattern 420 and may include the indent portion 425a that may be indented into the inter-cell recess R and the protrusion portion 425b that may be protruded toward the channel hole H from the charge trap pattern 420 under the second polysilicon residuals 429f.

Since the dielectric constant of air may be smaller than the oxide, the anti-coupling structure 425 having the air gap AG may have a dielectric constant smaller than the anti-coupling structure without the air gap. Thus, the coupling between the gate electrodes of the conductive structure 210, which may be formed in place of the sacrificial pattern S in a subsequent process, may be sufficiently prevented, reduced, or minimized due to the anti-coupling structure 425 in the inter-cell region C2.

Figure 33:
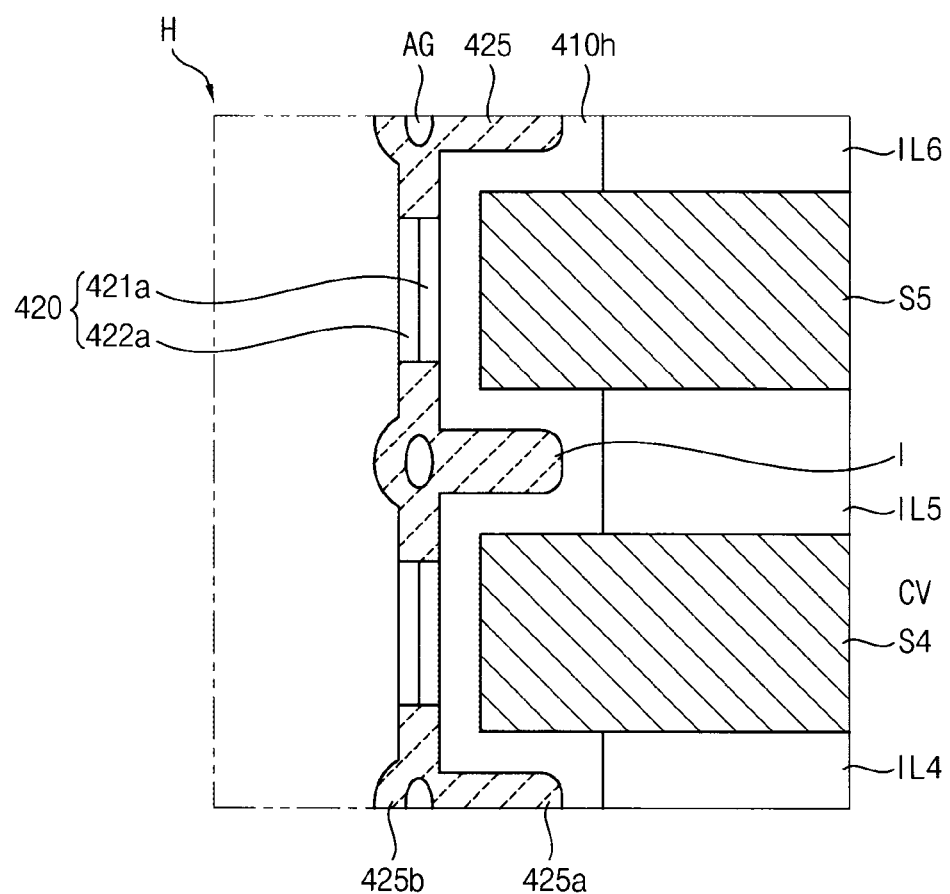

Referring to FIG. 33, the second polysilicon residuals 429f may be removed from the channel hole H and the charge trap pattern 420 may be exposed to the channel hole H. For example, the second polysilicon residuals 429f may be removed by a wet etching process or a dry etching process having an etching selectivity with respect to the charge trap pattern 425 and the anti-coupling structure 425.

Figure 34:
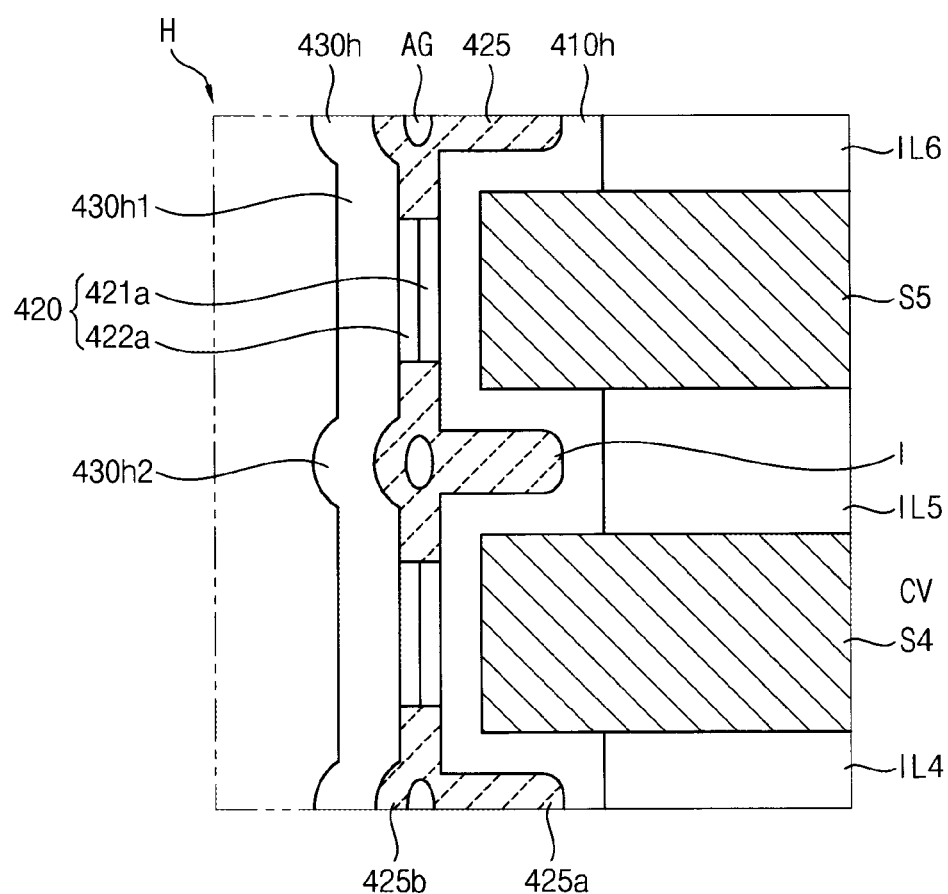

Referring to FIG. 34, a tunnel insulation layer 430h may be formed on the sidewall of the channel hole along a surface profile of the charge trap pattern 420 and the anti-coupling structure 425.

Thus, the tunnel insulation layer 430h may be formed on the separated linear pattern 422a and the protrusion portion 425b of the anti-coupling structure 425 along the first direction x, so the tunnel insulation layer 430h may also have a linear portion 430h1 making contact with the separated linear pattern 422a and a curvilinear portion 430h2 making contact with the protrusion portion 425b of the anti-coupling structure 425. The tunnel insulation layer 430h may be formed by the same process as described in detail with reference to FIG. 13B.

Then, the active column 300 may be formed in the channel hole H by the same process as described in detail with reference to FIG. 14B, thereby forming the third modification of the charge trap structure 400 as shown in FIG. 7. In some example embodiments, the active column 300 may also be formed into a linear pattern contact with the linear portion 430h1 of the tunnel insulation layer 430h around the sacrificial pattern S and may be formed into a curvilinear pattern contact with the curvilinear portion 430h2 of the tunnel insulation layer 430h around each insulation interlayer pattern IL.

Thereafter, the processing steps as described in detail with reference to FIGS. 15A to 18 may be further conducted, thereby forming the vertical memory device 1000 including the charge trap structure shown in FIG. 7.

Accordingly, since the anti-coupling structure 425 may have the air gap AG under the charge trap pattern 420 as well as the dielectric constant smaller than the charge trap pattern 420, the coupling and the electron diffusion between vertically neighboring stack cells may be sufficiently reduced and/or prevented by the anti-coupling structure 425.

According to the example embodiments of the vertical memory device and the method of manufacturing the same, the charge trap pattern may include first and second patterns continuously or discontinuously extending in the vertical direction. The first and the second patterns may be combined into a single combined pattern in the cell region and may be separated into a separated pattern in the inter-cell region in such a configuration that the anti-coupling structure may be enclosed by the separated pattern. The combined pattern may have a relatively larger thickness and the separated pattern may have a relatively smaller thickness, so the charge density in the cell region may increase in the cell region. In addition, the first and the second patterns may be elongated or be broken in the inter-cell region and the electron path for electron diffusion between the charge trap patterns in the cell region may be elongated or broken, which may reduce and/or prevent the electron diffusion between the neighboring stack cells and increase the charge density of the charge trap pattern.

Further, the anti-coupling structure may be indented into the inter-cell recess and the dielectric constant thereof may be smaller than those of the first and the second patterns, thus the neighboring gate electrodes of the vertical memory device may be sufficiently insulated and the coupling between the neighboring stack cells may be reduced and/or minimized in the vertical memory device. When the air gap may be provided with the anti-coupling structure, an overall dielectric constant of the anti-coupling structure may be much smaller than those of the first and the second patterns, thereby more sufficiently reducing and/or preventing the coupling between the neighboring stack cells in the vertical memory device. Accordingly, the operation reliability and stability of the vertical memory device may be sufficiently improved in spite of the high integration degree and the size down of the memory device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A vertical memory device comprising:
   a substrate;
   a gate stack structure on the substrate, the gate stack structure including conductive structures and insulation interlayer structures that are alternately stacked on each other in a vertical direction such that cell regions and inter-cell regions are alternately arranged in the vertical direction;
   a channel structure on the substrate, the channel structure penetrating through the gate stack structure in the vertical direction; and
   a charge trap structure between the gate stack structure and the channel structure, the charge trap structure and the conductive structures defining memory cells at the cell regions, the charge trap structure configured to selectively store charges, the charge trap structure including an anti-coupling structure in the inter-cell regions for reducing a coupling between the memory cells that neighbor each other in the vertical direction, wherein
   the charge trap structure includes a block pattern, a tunnel insulation pattern, and a charge trap pattern,
   the block pattern contacts the gate stack structure and extends in the vertical direction,
   the tunnel insulation pattern has a cylinder shape,
   the tunnel insulation pattern encloses that channel structure and contacts the channel structure,
   the charge trap pattern includes a plurality of traps for storing the charges,
   the charge trap pattern is between the block pattern and the tunnel insulation pattern,
   the charge trap pattern includes a first pattern covering the block pattern and a second pattern covering the tunnel insulation pattern, and
   the anti-coupling structure is enclosed by the first pattern and the second pattern in the inter-cell regions.

2. The vertical memory device of claim 1, wherein
   the gate stack structure includes an inter-cell recess defined by a pair of the conductive structures that neighbor each other in the vertical direction and the insulation interlayer structure between the pair of the conductive structures that neighbor each other, and
   the block pattern and the first pattern extend continuously in the vertical direction and are recessed into the inter-cell recess conformal with a surface profile of the inter-cell recess.

3. The vertical memory device of claim 2, wherein
   the first pattern includes a vertical portion, a horizontal portion, and a connection portion,
   the horizontal portion extends in the vertical direction such that horizontal portions extends parallel to a sidewall of the conductive structures in the cell regions,
   the horizontal portion extends in a horizontal direction substantially perpendicular to the vertical direction and in parallel with one of top and bottom surfaces of the conductive structures in the inter-cell recess, and
   the connection portion is connected with the vertical portions and the horizontal portions, so that the first pattern is indented into the inter-cell recess.

4. The vertical memory device of claim 3, wherein
   the second pattern includes a linear pattern extending continuously in the vertical direction and making contact with the vertical portion of the first pattern in the cell regions such that the anti-coupling structure is enclosed by the linear pattern and the horizontal portion and the connection portion of the first pattern in the inter-cell regions.

5. The vertical memory device of claim 4, wherein the anti-coupling structure is indented into the inter-cell recess from a central portion of the charge trap pattern conformal with the surface profile of the inter-cell recess.

6. The vertical memory device of claim 3, wherein
   the second pattern includes a linear portion and a convex portion,
   the linear portion of the second pattern contacts the vertical portion of the first pattern in the cell regions, and
   the convex portion of the second pattern is connected to the linear portion and swelled toward the channel structure in the inter-cell regions such that the anti-coupling structure is enclosed by the convex portion of the second pattern and the horizontal portion and the connection portion of the first pattern.

7. The vertical memory device of claim 6, wherein
   the anti-coupling structure includes an indent portion and a protrusion portion,
   the indent portion is indented into the inter-cell recess from a central portion of the charge trap pattern, and
   the protrusion portion protrudes toward the channel structure from the central portion of the charge trap pattern conformal with a shape of the convex portion of the second pattern.

8. The vertical memory device of claim 7, wherein the convex portion of the second pattern is partially separated in the inter-cell regions such that the protrusion portion of the anti-coupling structure contacts the tunnel insulation pattern.

9. A vertical memory device comprising:
   a substrate;
   a gate stack structure on the substrate, the gate stack structure including conductive structures and insulation interlayer structures that are alternately stacked on each other in a vertical direction such that cell regions and inter-cell regions are alternately arranged in the vertical direction;

a channel structure on the substrate, the channel structure penetrating through the gate stack structure in the vertical direction; and a charge trap structure between the gate stack structure and the channel structure, the charge trap structure and the conductive structures defining memory cells at the cell regions, the charge trap structure configured to selectively store charges, the charge trap structure including an anti-coupling structure in the inter-cell regions for reducing a coupling between the memory cells that neighbor each other in the vertical direction, wherein the charge trap structure includes a block pattern, a tunnel insulation pattern, and a charge trap pattern, the block pattern contacts the gate stack structure and extends in the vertical direction, the tunnel insulation pattern has a cylinder shape, the tunnel insulation pattern encloses that channel structure and contacts the channel structure, the charge trap pattern includes a plurality of traps for storing the charges, the charge trap pattern is between the block pattern and the tunnel insulation pattern, the charge trap pattern includes a first pattern covering the block pattern and a second pattern covering the tunnel insulation pattern, and the charge trap pattern is arranged only in the cell regions, and the anti-coupling structure is enclosed by the block pattern and the tunnel insulation pattern in the inter-cell regions.

10. The vertical memory device of claim 9, wherein the gate stack structure includes an inter-cell recess defined by a pair of the conductive structures that neighbor each other in the vertical direction and the insulation interlayer structures between the pair of the conductive structures that neighbor each other, and the block pattern continuously extends in the vertical direction and is recessed into the inter-cell recess conformal with a surface profile of the inter-cell recess.

11. The vertical memory device of claim 10, wherein the anti-coupling structure includes an indent portion and a protrusion portion, the indent portion is indented into the inter-cell recess from a central portion of the charge trap pattern, and the protrusion portion protrudes toward the channel structure from the central portion of the charge trap pattern.

12. The vertical memory device of claim 11, wherein the anti-coupling structure includes an air gap aligned with the central portion of the charge trap pattern along the vertical direction.

13. The vertical memory device of claim 11, wherein the tunnel insulation pattern includes a swelling portion, the swelling portion is swelled toward the channel structure in the inter-cell regions corresponding to the protrusion portion of the anti-coupling structure.

14. A vertical memory device comprising:

a substrate;

a gate stack structure on the substrate, the gate stack structure including a plurality of conductive layers and a plurality of insulating layers alternately stacked on top of each other;

a channel structure extending in a vertical direction through the gate stack structure; and a charge trap structure surrounding the channel structure, the charge trap structure including a plurality of anti-coupling structures spaced apart from each other in the vertical direction along the channel structure at heights above the substrate corresponding to the plurality of insulating layers such that the anti-coupling structures are between the channel structure and the plurality of insulating layers, wherein the charge trap structure includes a tunnel insulation pattern surrounding the channel structure and a block pattern extending between the tunnel insulation pattern and the gate stack structure, the plurality of conductive layers each include a first side wall facing the channel structure, the plurality of insulating layers each include a first side facing the channel structure, the plurality of conductive layers and the plurality of insulating layers define recesses between the conductive layers that neighbor each other based on the first sides of the plurality of insulating layers being recessed away from the channel structure, the block pattern extends contiguously along the first side walls of the plurality of conductive layers and into the recesses along the first sides of the plurality of insulating layers, and the plurality of anti-coupling structures are at least partially positioned in the recesses between the conductive layers that neighbor each other.

15. The vertical memory device of claim 14, wherein the plurality of anti-coupling structures includes each include an indent portion and a protrusion portion, the indent portion extends into the recesses between the conductive layers that neighbor each other from a central portion of the plurality of anti-coupling structures, and the protrusion portion protrudes toward the channel structure.

16. The vertical memory device of claim 14, wherein the charge trap structure includes a first pattern and a second pattern, the first pattern extends between the block pattern and the plurality of anti-coupling structures and between the block pattern and the channel structure, the second pattern extends between the first pattern and the tunnel insulation pattern and between at least part of the plurality of anti-coupling structures and the tunnel insulation pattern, and the first pattern and the second pattern contact each other at heights above the substrate corresponding to the plurality of conductive layers, and the first pattern and the second pattern are spaced apart from each other at levels above the substrate corresponding to the plurality of anti-coupling structures.

17. The vertical memory device of claim 16, wherein the plurality of anti-coupling structures include silicon oxide, a first one of the first pattern and the second pattern includes silicon nitride, and a second one of the first pattern and the second pattern includes silicon oxynitride.

* * * * *